United States Patent
Jain et al.

(10) Patent No.: US 10,586,884 B2
(45) Date of Patent: Mar. 10, 2020

(54) THIN-FILM, FLEXIBLE MULTI-JUNCTION OPTOELECTRONIC DEVICES INCORPORATING LATTICE-MATCHED DILUTE NITRIDE JUNCTIONS AND METHODS OF FABRICATION

(71) Applicant: ALTA DEVICES, INC., Sunnyvale, CA (US)

(72) Inventors: Nikhil Jain, Sunnyvale, CA (US); Brendan M. Kayes, Los Gatos, CA (US); Gang He, Cupertino, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 0 days.

(21) Appl. No.: 16/011,516

(22) Filed: Jun. 18, 2018

(65) Prior Publication Data

US 2019/0386170 A1 Dec. 19, 2019

(51) Int. Cl.
*H01L 21/00* (2006.01)
*H01L 31/18* (2006.01)
(Continued)

(52) U.S. Cl.
CPC .... *H01L 31/1848* (2013.01); *H01L 31/02168* (2013.01); *H01L 31/02327* (2013.01);
(Continued)

(58) Field of Classification Search
CPC .......... H01L 31/1848; H01L 31/02168; H01L 31/02327
(Continued)

(56) References Cited

U.S. PATENT DOCUMENTS 8,451,875 B2 * 5/2013 Johnson .............. H01S 5/18308
372/43.01
8,865,489 B2 * 10/2014 Rogers ................ H01L 25/0753
438/27
(Continued)

FOREIGN PATENT DOCUMENTS

CN 103426965 B 12/2016
KR 101293120 B1 8/2013
(Continued)

OTHER PUBLICATIONS

Jones-Albertus, R., et al., "Using Dilute Nitrides to Achieve Record Solar Cell Efficiencies," Mater.Res Soc.Symp. Proc. vol. 1538, Materials Research Society, pp. 161-166, 2013.
(Continued)

*Primary Examiner* — David S Blum
(74) *Attorney, Agent, or Firm* — Arent Fox LLP

(57) ABSTRACT

A multi-junction optoelectronic device and method of fabrication are disclosed. In an aspect, the method includes forming a first p-n structure on a substrate, the first p-n structure including a semiconductor having a lattice constant that matches a lattice constant of the substrate; forming one or more additional p-n structures on the first p-n structure, each of the one or more additional p-n structures including a semiconductor having a lattice constant that matches the lattice constant of the substrate, the semiconductor of a last of the one or more additional p-n structures that is formed including a dilute nitride, and the multi-junction optoelectronic device including the first p-n structure and the one or more additional p-n structures; and separating the multi-junction optoelectronic device from the substrate. In some implementations, it is possible to have the dilute nitride followed by a group IV p-n structure.

34 Claims, 14 Drawing Sheets

(51) Int. Cl.
  *H01L 31/0687* (2012.01)
  *H01L 31/0725* (2012.01)
  *H01L 31/0735* (2012.01)
  *H01L 31/0216* (2014.01)
  *H01L 33/00* (2010.01)
  *H01L 33/04* (2010.01)
  *H01L 31/0232* (2014.01)
  *H01L 21/02* (2006.01)

(52) U.S. Cl.
  CPC ...... *H01L 31/0687* (2013.01); *H01L 31/0725* (2013.01); *H01L 31/0735* (2013.01); *H01L 33/007* (2013.01); *H01L 33/04* (2013.01); *H01L 21/02304* (2013.01)

(58) Field of Classification Search
  USPC .......................................................... 438/94
  See application file for complete search history.

(56) References Cited

U.S. PATENT DOCUMENTS

| | | | | |
|---|---|---|---|---|
| 2008/0023067 A1* | 1/2008 | Hu | ................. | B82Y 10/00 136/256 |
| 2012/0037930 A1* | 2/2012 | Hoppel | ............. | H01L 33/0079 257/88 |
| 2013/0118566 A1* | 5/2013 | Jones-Albertus | ....... | H01L 31/06 136/255 |
| 2014/0076387 A1* | 3/2014 | King | ................... | H01L 31/0725 136/255 |
| 2014/0261611 A1* | 9/2014 | King | ................... | H01L 31/0352 136/244 |
| 2016/0005909 A1 | 1/2016 | Newman | | |
| 2016/0149066 A1 | 5/2016 | Sato | | |
| 2016/0372624 A1* | 12/2016 | Yanka | ............... | H01L 31/03044 |
| 2017/0025484 A1* | 1/2017 | Forrest | ................... | H01L 51/56 |
| 2017/0092800 A1* | 3/2017 | Derkacs | ................ | H01L 31/078 |
| 2017/0110613 A1 | 4/2017 | Suarez et al. | | |
| 2018/0366609 A1* | 12/2018 | Ritenour | ............ | H01L 31/1844 |

FOREIGN PATENT DOCUMENTS

| | | |
|---|---|---|
| KR | 20130139070 A | 12/2013 |
| WO | 2017132534 A1 | 8/2017 |

OTHER PUBLICATIONS

International Search Report and Written Opinion corresponding the PCT Application No. PCT/US2019/023601, dated Jun. 3, 2019.

* cited by examiner

THIN-FILM, FLEXIBLE MULTI-JUNCTION OPTOELECTRONIC DEVICES INCORPORATING LATTICE-MATCHED DILUTE NITRIDE JUNCTIONS AND METHODS OF FABRICATION

CROSS-REFERENCE TO RELATED APPLICATIONS

The present application is related to U.S. patent application titled "THIN-FILM, FLEXIBLE OPTOELECTRONIC DEVICES INCORPORATING A SINGLE LATTICE-MATCHED DILUTE NITRIDE JUNCTION AND METHODS OF FABRICATION," filed herewith and having Ser. No. 16/011,531, the content of which is incorporated herein by reference in its entirety.

BACKGROUND OF THE DISCLOSURE

Aspects of the present disclosure generally relate to multi-junction optoelectronic devices, and more particularly to thin-film, flexible multi-junction optoelectronic devices incorporating lattice-matched dilute nitride junctions and methods of fabricating of the multi-junction optoelectronic devices.

There is a need for providing optoelectronic devices (e.g., photovoltaic cells) that have improved energy-capture efficiency when compared to the efficiency of conventional optoelectronic devices. These improved devices need to be, however, cost effective, easily implemented and/or adaptable to existing environments. The present disclosure describes various aspects of technical solutions that address such needs.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

This disclosure describes thin-film, flexible multi-junction optoelectronic devices incorporating lattice-matched dilute nitride junctions and methods of fabricating of the multi-junction optoelectronic devices. For example, the disclosure describes various aspects of a multi-junction solar cell design that is extendable to four (4) or more junctions, can be grown lattice-matched to a GaAs substrate or a Ge substrate, and is compatible with epitaxial lift-off (ELO) or similar substrate reuse technologies (such as spalling, laser lift-off, exfoliation, etc.). Moreover, the techniques described herein allow for growth of the multi-junction optoelectronic device in an inverted direction.

In an aspect, a method for fabricating a multi-junction optoelectronic device is described that includes forming a first p-n structure on a substrate, the first p-n structure including a semiconductor having a lattice constant that matches a lattice constant of the substrate. The method further includes forming one or more additional p-n structures on the first p-n structure, each of the one or more additional p-n structures including a semiconductor having a lattice constant that matches the lattice constant of the substrate, the semiconductor of a last of the one or more additional p-n structures that is formed including a dilute nitride, and the multi-junction optoelectronic device including the first p-n structure and the one or more additional p-n structures. Moreover, the method includes separating the multi-junction optoelectronic device from the substrate.

In an aspect, another method for fabricating a multi-junction optoelectronic device is described that includes forming a first p-n structure on a substrate, the first p-n structure including a semiconductor having a lattice constant that matches a lattice constant of the substrate. The method further includes forming one or more additional p-n structures on the first p-n structure, each of the one or more additional p-n structures including a semiconductor having a lattice constant that matches the lattice constant of the substrate, the semiconductor of a next to last of the one or more additional p-n structures that is formed including a dilute nitride, the semiconductor of a last of the one or more additional p-n structures that is formed including a group IV semiconductor, and the multi-junction optoelectronic device including the first p-n structure and the one or more additional p-n structures. Moreover, the method includes separating the multi-junction optoelectronic device from the substrate.

The multi-junction optoelectronic devices described herein ending with a dilute nitride or group IV as the bottom junction can be configured to also include a back reflector and/or other optical engineered structures or layers, which may be grown, deposited or formed along with the various p-n structures or subcells of the multi-junction optoelectronic device.

Additional aspects related to thin-film, flexible multi-junction optoelectronic devices incorporating lattice-matched dilute nitride junctions and methods of fabricating of the multi-junction optoelectronic devices are also described.

BRIEF DESCRIPTION OF THE DRAWINGS

The appended drawings illustrate only some implementation and are therefore not to be considered limiting of scope.

DETAILED DESCRIPTION

Figure 1A:
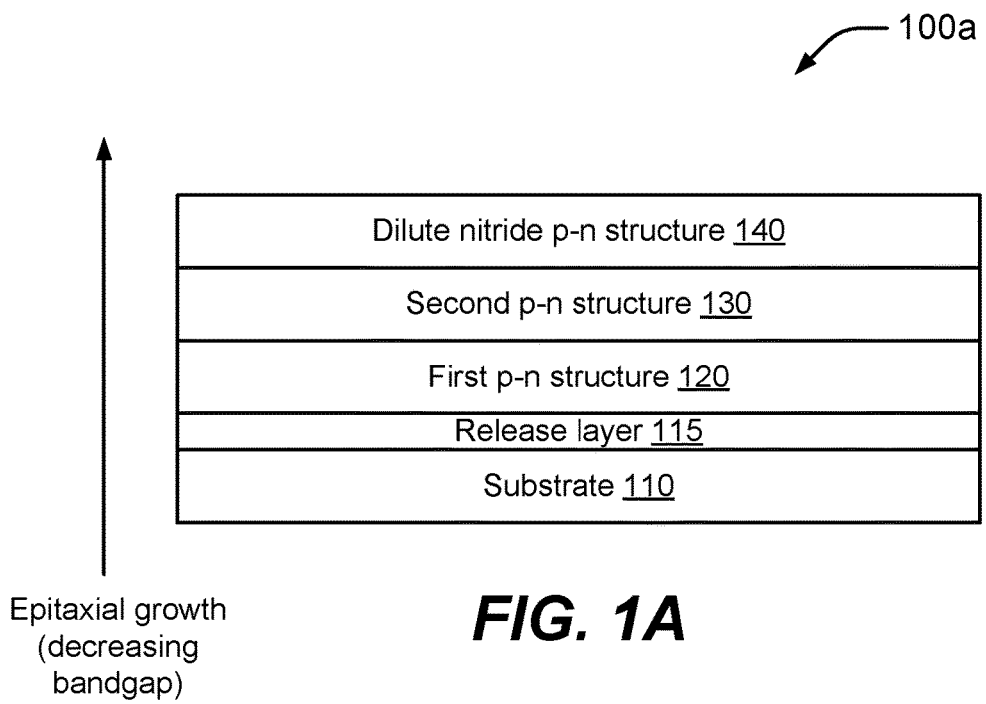
FIGS. 1A and 1B are diagrams that illustrate examples of a multi-junction optoelectronic device with 3 junctions (3J) or p-n structures with dilute nitride as a bottom junction in accordance with aspects of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

As described above, the present disclosure relates to multi-junction optoelectronic devices that incorporate lattice-matched dilute nitride junctions and the fabrication processes for forming such multi-junction optoelectronic devices. Accordingly, the present disclosure describes various aspects of the fabrication of thin film devices, such as photovoltaic devices, light-emitting diodes (LEDs), or other optoelectronic devices, that can be used as the multi-junction optoelectronic devices described herein.

It is desirable to improve the performance of an optoelectronic device such as a photovoltaic cell or an LED, for example, to improve the efficiency thereof without significantly affecting the cost or adding to overall size of the device. These devices should, therefore, be cost effective, easily implemented and/or adaptable to existing environments. The present disclosure describes various aspects of technical solutions that address such needs.

Generally, the performance of an optoelectronic device such as a photovoltaic cell (e.g., solar cell) or LEDs is improved by improving the light absorption/conversion efficiency of the cell or the light generation efficiency of the LED. High efficiency photovoltaic cells can be fabricated by growing materials with different band-gaps such that the highest band-gap material is on the light-facing side (e.g., front side) and the lowest bandgap material is on the opposite side (e.g., back side). This results in the absorption of photons with different energy by different layers, improving the efficiency of the photovoltaic cell since this arrangement results. By having a series combination of stacked solar cells (e.g., adjacent p-n structures or subcells in a multi-junction optoelectronic device), each can have the same current and their respective voltages are linearly added to give overall higher efficiency and, therefore, power. This can be achieved using different approaches (lattice-matched, metamorphic, bonding etc.); however, each approach has its own advantages and disadvantages.

Growing multiple layers of differing bandgap materials (i.e., materials having different energy gaps) is desired for improving efficiency, but may require materials of different lattice constant to achieve optimal bandgap combination. The lattice mismatch between the growth substrate and the different layers, may lower the overall efficiency of the resulting photovoltaic cell (with similar inefficiencies arising in the operation of light-emitting diodes). Another approach is to grow lattice-mismatched multi-junction optoelectronic devices (e.g., lattice-mismatched multi-junction solar cells) using a metamorphic graded layer to allow for difference in lattice constants, for example, using InGaAs as the bottom junction. The metamorphic approach leads to a lot of wasted metalorganic chemical vapor deposition (MOCVD) precursor material and reduced MOCVD tool throughput, as well as bulkier and thicker devices.

For optoelectronic devices such as photovoltaic cells (e.g., solar cells) and LEDs, lattice-matched systems based on group III-V semiconductor materials that use standard alloys such as (AlGaIn)(PAsSb) do not allow to grow lattice-matched materials below the bandgap of GaAs (~1.41 eV). As described above, to increase the efficiency of optoelectronic devices, multiple junctions may be used with different bandgaps to capture or collect energy from different parts of the spectrum. Therefore, in order to surpass the efficiency of state-of-the-art lattice-matched GaInP/GaAs (32.8%), a third junction with a bandgap around ~1.0 eV is generally desired. This can be achieved by growing the metamorphic (or lattice-mismatched) GaInAs junction (with a bandgap of ~1 eV) described above using a compositionally graded buffer to bridge the lattice-constant from GaAs to GaInAs. This approach, however, requires expensive and bulky metamorphic buffers. Moreover, even for ideal series-connected dual-junction solar cells (with bandgaps of ~1.7 eV and ~1.1 eV), the optimal bandgap combination requires a bottom cell or junction with a bandgap that is less than 1.4 eV, which is not attainable with the palate of standard group III-V semiconductors materials (AlGaIn)(PAsSb).

Dilute nitride alloys or simply dilute nitrides (e.g., GaInAsN(Sb) alloys), can be grown lattice-matched to a GaAs substrate with their bandgap tunable below 1.4 eV to (e.g., 0.8 eV-1.3 eV). Therefore, dilute nitride alloys could allow lattice-matched solar cells even beyond four (4) junctions or p-n structures with AM 1.5 G efficiencies approaching 38-39%. This approach is attractive for various reasons. For example, it is possible to epitaxially grow the entire stack or layers of the optoelectronic device lattice-matched and in the inverted direction to complement existing epitaxial lift off (ELO) processes. The proposed approach could enable lightweight and flexible multi-junction optoelectronic devices (e.g., multi-junction solar cells) without the need for thick and expensive metamorphic buffers.

Therefore, the present disclosure proposes the fabrication of multi-junction optoelectronic devices with dilute nitride junctions or p-n structures in an inverted direction and using a lift off process. This approach enables the fabrication of thin-film, multi-junction optoelectronic devices that are lightweight and flexible and can provide high efficiencies by including three (3) or more junctions. For example, the multi-junction optoelectronic devices can be made flexible such that they can support a radius of curvature of 1 cm to 850 cm, for example. Moreover, these multi-junction optoelectronic devices can be lightweight in that the can have a specific power (or energy density) 500 W/kg to 5000 W/kg, an areal energy density of 200 $W/m^2$ to 500 $W/m^2$, and an areal mass density (weight/area) of 0.05 $kg/m^2$ to 0.5 $kg/m^2$, for example. In addition, these multi-junction optoelectronic devices support spectrum from AM0 to AM1.5.

The thin film devices described herein (e.g., multi-junction optoelectronic devices such as photovoltaic cells or LEDs) generally contain epitaxially grown layers which are formed on a release or sacrificial layer disposed on or over a support substrate or wafer. The thin film devices thus formed can be flexible single crystal devices. Once the thin film devices are formed by epitaxy processes, the thin film devices are subsequently removed or separated from the support substrate or wafer, for example during an epitaxial lift off (ELO) process, a laser lift off (LLO) process, or a spalling process, for example.

As used in this disclosure, a layer can be described as being deposited or grown "on" or "over" one or more other layers. This term indicates that the layer can be deposited or grown directly on top of the other layer(s), or can indicate that one or more additional layers can be deposited between the layer and the other layer(s) in some embodiments or implementations. Also, the other layer(s) can be arranged in any order. To describe the features of the present disclosure in more detail reference is made to the following discussion in conjunction with the accompanying figures.

FIG. 1A shows a diagram 100a that illustrates a general example of a multi-junction optoelectronic device with three (3) junctions or p-n structures (e.g., a 3J multi-junction optoelectronic device). In this example, there is a substrate or wafer 110 on which a release layer 115 is disposed. Although the substrate 110 is shown as a single layer it may include multiple layers. The substrate 110 can be made of GaAs or Ge, for example.

The release layer 115, sometimes referred to as a sacrificial layer, may be provided to enable lift off or separation of the multi-junction optoelectronic device from the substrate 100. In some implementations, the release layer 115 can be disposed on the substrate prior to deposition of the p-n structure, for example, to enable liftoff or separation of the p-n structure by using an epitaxial lift off (ELO) process or other similar process. The release layer 115 can comprise AlAs, AlGaAs, AlGaInP, or AlInP, or other layers with high Al content, or combinations thereof and is utilized to form a lattice structure for the various layers contained within the multi-junction optoelectronic device, and then etched and removed during the ELO process. In other implementations, alternative liftoff processes such as laser lift off (LLO), ion implantation and liftoff, liftoff by etching of a buried oxide layer or a buried porous layer, or spalling can be used. The Al content in the release layer 115 can vary. For example, when the release layer 115 includes AlGaAs, the concentration can be $Al_xGa_{1-x}As$ (where x=1 to 0.3). In another example, when the release layer 115 includes AlGaInP, the concentration can be $(Al_xGa_{1-x})_{0.5}In_{0.5}P$ (where x=1 to 0).

The multi-junction optoelectronic device is then grown or deposited (these terms could be used interchangeably) over the release layer 115. For example, the multi-junction optoelectronic device in this example includes three junctions or p-n structures as described above. A first p-n structure 120 is epitaxially grown on the release layer 115, a second p-n structure 130 is epitaxially grown on the first p-n structure 120, and a third p-n structure, a dilute nitride p-n structure 140, is epitaxially grown on the second p-n structure 130.

A p-n structure can refer to a structure having one or more semiconductor layers and where one or more p-n junctions are formed with the one or more semiconductor layers. Accordingly, each of the p-n structures in the multi-junction optoelectronic device in the diagram 100a can include one or more p-n junctions. Position of the junction (the position of the p-n junction in each of the p-n structure maybe formed near the front side of the device (light inside) or farther away from the incident side of the light (commonly referred as rear-heterojunction device). Each respective p-n structure could be a homojunction (that is, both sides of the junction in the p-n structure are comprised of the same material) or could be a heterojunction (that is, one side of the junction in the p-n structure may be comprised of a material of larger bandgap than the thick absorber/base layer).

Moreover, each of the p-n structures in the multi-junction optoelectronic device in the diagram 100a is lattice-matched to the substrate 110. That is, the lattice constants of the materials from which the p-n structures are made are the same as the lattice constant of the material from which the substrate is made. One of ordinary skill can recognize that such matching of lattice constants also includes materials with lattice constants nearly (substantially) matching each other. Matching or substantially matching of lattice constants refers to allowing two different and adjacent semiconductor materials a region of bandgap change to be formed without introducing a change in crystal structure. In an example, the lattice constant of the material or semiconductor of each of the p-n structures matches the lattice constant of the substrate 110 with a mismatch or strain of <0.4%.

In this example, the multi-junction optoelectronic device is epitaxially grown as sunny side down (e.g., side receiving light is grown first) with decreasing bandgap from the first p-n structure 120 to the dilute nitride p-n structure 140. That is, the material(s) from which the first p-n structure 120 is made has a larger bandgap than the material(s) from which the second p-n structure 130 is made, which in turn has a larger bandgap than the dilute nitride(s) from which the dilute nitride p-n structure 140 is made. Because of the sunny side down growth approach used to fabricate the multi-junction optoelectronic device in FIG. 1A, the dilute nitride p-n structure 140, which is grown as a top junction or top p-n structure, is referred to as a bottom junction or bottom p-n structure because of its position relative to a source of energy during operation of the multi-junction optoelectronic device.

In some implementations, the first p-n structure 120 and the second p-n structure 130 can be made of group III-V semiconductor materials such as InGaP or GaAs, for example. The third p-n structure, that is, the dilute nitride p-n structure 140 can be made of dilute nitride alloys such as GaInNAs or GaInNAsSb, more generally referred to as GaInAsN(Sb), or derivatives thereof. In one compositional example, the dilute nitride p-n structure 140 includes $Ga_{1-y}In_yAs_{1-x-z}N_xSb_z$, where a concentration y of In is in the range of 0-20%, a concentration x of N is in the range of 0-6%, and a concentration z of Sb is in the range of 0-8%.

The first p-n structure 120 and the second p-n structure 130 can be formed by epitaxial growth using various techniques, for example, metalorganic chemical vapor deposition (MOCVD), molecular beam epitaxy (MBE), metalorganic vapor phase epitaxy (MOVPE or OMVPE), liquid phase epitaxy (LPE), hydride vapor phase epitaxy (HVPE), close-spaced vapor transport (CSVT) epitaxy, etc. In some implementations, each of the first p-n structure 120 and the second p-n structure 130 is substantially a single crystal. That is, the first p-n structure 120 and the second p-n structure 130 can each include a single-crystalline semiconductor material.

In some implementations, the epitaxially grown layers of group III-V semiconductor materials can be formed using a high growth rate deposition process (e.g., a high growth rate vapor deposition process). The high growth rate deposition process is such that grown materials are of sufficient quality for use in the types of optoelectronic devices described herein. The high growth rate deposition process allows for growth rates of greater than 1 μm/hr, such as about 10 μm/hr or greater, or as high as about 100 μm/hr or greater. For example, the growth rates can be about 10 µm/hr, about 20 µm/hr, about 30 µm/hr, about 40 m/hr, about 50 µm/hr, about 60 µm/hr, about 70 µm/hr, about 80 µm/hr, about 90 µm/hr, or about 100 µm/hr, some specific rate between any two of these values (e.g., about 25 µm/hr—between 20 µm/hr and 30 µm/hr), or some range between any two of these values (e.g., range from about 20 µm/hr to about 30 µm/hr). In some implementations, the high growth rate deposition process allows for growth rates of greater than 100 µm/hr, including growth rates of about 120 µm/hr. The term "about" as used in this disclosure can indicate a variation of 1%, 2%, 3%, 4%, 5%, or 10%, for example, from a nominal value. The high growth rate deposition process includes heating a substrate or wafer to a deposition temperature of about 550° C. or greater (e.g., the deposition temperature can be as high as 750° C. or 850° C.), within a processing system, exposing the wafer to a deposition gas containing a chemical precursor, such as a group III-containing precursor gas and a group V-containing precursor gas, and depositing a layer containing a group III-V semiconductor material on the substrate or wafer. The group III-containing precursor gas can contain a group III element, such as indium, gallium, or aluminum as individual or combined precursor gases. For example, the group III-containing precursor gas can be one of trimethyl aluminum, triethyl aluminum, trimethyl gallium, triethyl gallium, trimethyl indium, triethyl indium, di-isopropylmethylindium, or ethyldimethylindium. The group V-containing precursor gas can contain a group V element or a combination of nitrogen, phosphorus, arsenic, or antimony as individual or combined precursor gases. For example, the group V-containing precursor gas can be one of phenyl hydrazine, dimethylhydrazine, tertiarybutylamine, ammonia, phosphine, tertiarybutyl phosphine, bisphosphinoethane, arsine, tertiarybutyl arsine, monoethyl arsine, trimethyl arsine, trimethyl antimony, triethyl antimony, or tri-isopropyl antimony, stibine. This list of precursors is not meant to be an exhaustive list, it could include any precursors that can be used to deposit alloys compromising of Al, Ga, In, As, P, N, Sb.

In an implementation, each of the first p-n structure 120 and the second p-n structure 130 can include multiple p-n junctions, for example, a first p-n junction, a second p-n junction up to an $N^{th}$ p-n junction. That is, the first p-n structure 120 and/or the second p-n structure 130 can include one, two, or more p-n junctions. When N p-n junctions are included in a p-n structure, each of the first through $N-1^{th}$ p-n junction can contain various arsenide, phosphide, and nitride layers, such as AlGaAs, InGaAs, AlInGaAsP, AlInP, InGaP, AlInGaP, alloys thereof, derivatives thereof, or combinations thereof. For example, the nitride and phosphide layers can include one or more of InGaP, AlInGaP, GaN, InGaN, AlGaN, AlInGaN, GaP, alloys of any of these, or derivatives of any of these. The nth p-n junction can contain various arsenide, phosphide, and nitride layers, such as GaAs, AlGaAs, InGaAs, AlInGaAs, InGaAsP, AlInGaAsP, alloys thereof, derivatives thereof and combinations thereof. In general each of these p-n junctions includes a group III-V semiconductor material and includes at least one of gallium, aluminum, indium, phosphorus, nitrogen, or arsenic.

For some implementations, each of the first p-n structure 120 and the second p-n structure 130 can have interface or intermediate layers formed between an emitter layer and a base layer (e.g., between emitter and base layers in a p-n junction or a p-n structure). The intermediate layer can comprise any suitable group III-V semiconductor material, such as GaAs, AlGaAs, InGaP, AlInGaP, InGaAsP, AlIn- GaAsP, AlInP, or a combination thereof. The intermediate layer can be n-doped, p-doped, or not intentionally doped. The thickness of the intermediate layer can be in the range of about 5 nm to about 400 nm, for example. The intermediate layer is located between a p-doped layer and an n-doped layer, and can be comprised of the same material as either the n-doped layer or the p-doped layer, or can be comprised of a different material from either the n-doped layer or the p-doped layer, and/or can a layer of a graded composition. The intermediate layer thus formed can provide a location offset for one or more heterojunctions from a corresponding p-n junction. Such an offset can allow for reduced dark current within the device, improving its performance.

Like the first p-n structure 120 and the second p-n structure 130, the dilute nitride p-n structure 140 can be formed by epitaxial growth using the same or different techniques, from those described above. In some implementations, the dilute nitride p-n structure 140 is substantially a single crystal. Moreover, like the first p-n structure 120 and the second p-n structure 130, the dilute nitride p-n structure 140 can include multiple p-n junctions, for example, a first p-n junction, a second p-n junction up to an Nth p-n junction. That is, the dilute nitride p-n structure 140 can include one, two, or more p-n junctions. Moreover, the dilute nitride p-n structure 140 can have interface or intermediate layers formed between an emitter layer and a base layer (e.g., between emitter and base layers in a p-n junction or a p-n structure).

The deposition processes for depositing or forming group III-V semiconductor materials for the first p-n structure 120 and the second p-n structure 130, as described herein, can be conducted in various types of deposition chambers. For example, one continuous feed deposition chamber that can be utilized for growing, depositing, or otherwise forming group III-V semiconductor materials. The deposition process for the dilute nitride alloys used in the dilute nitride p-n structure 140 can be conducted in various deposition chambers, and in some implementations, can be conducted in a separate and/or different chamber than used for depositing or forming group III-V semiconductor materials.

Figure 1B:
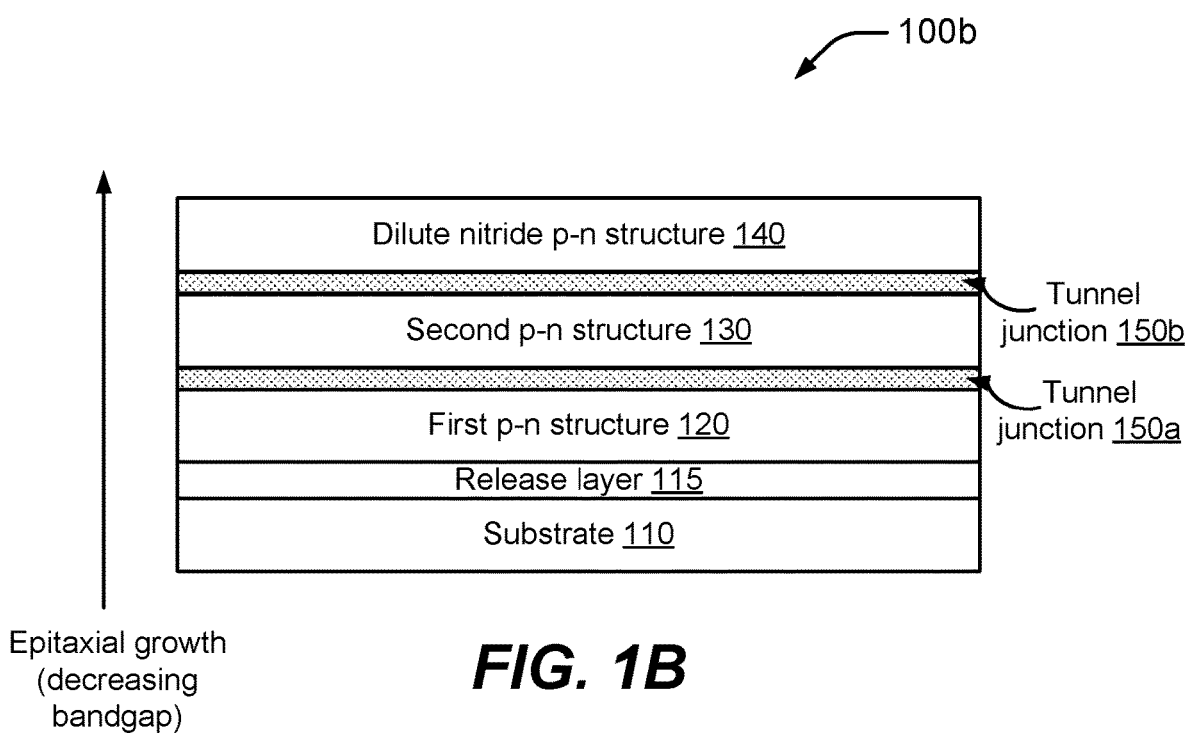

FIG. 1B shows a diagram 100b that illustrates the multi-junction optoelectronic device in FIG. 1A with optional tunnel junctions provided between the p-n structures. For example, a tunnel junction 150a is grown, deposited, or otherwise disposed between the first p-n structure 120 and the second p-n structure 130. Similarly, a tunnel junction 150b is grown, deposited, or otherwise disposed between the second p-n structure 130 and the dilute nitride p-n structure 140.

The p-n junctions within each of the first p-n structure 120, the second p-n structure 130, and the dilute nitride p-n structure 140 are voltage generating p-n junctions of the multi-junction optoelectronic device. The tunnel junctions 150a and 150b can be grown based on group III-V semiconductor materials (e.g., GaAs, AlGaAs, or AlGaInP) by using the same or similar equipment and techniques as described herein to grow the first p-n structure 120 or the second p-n structure 130. The tunnel junction 150a and 150b can be used to provide electrical coupling between the multiple p-n structures and/or multiple p-n junctions within the p-n structures.

Figure 1C:
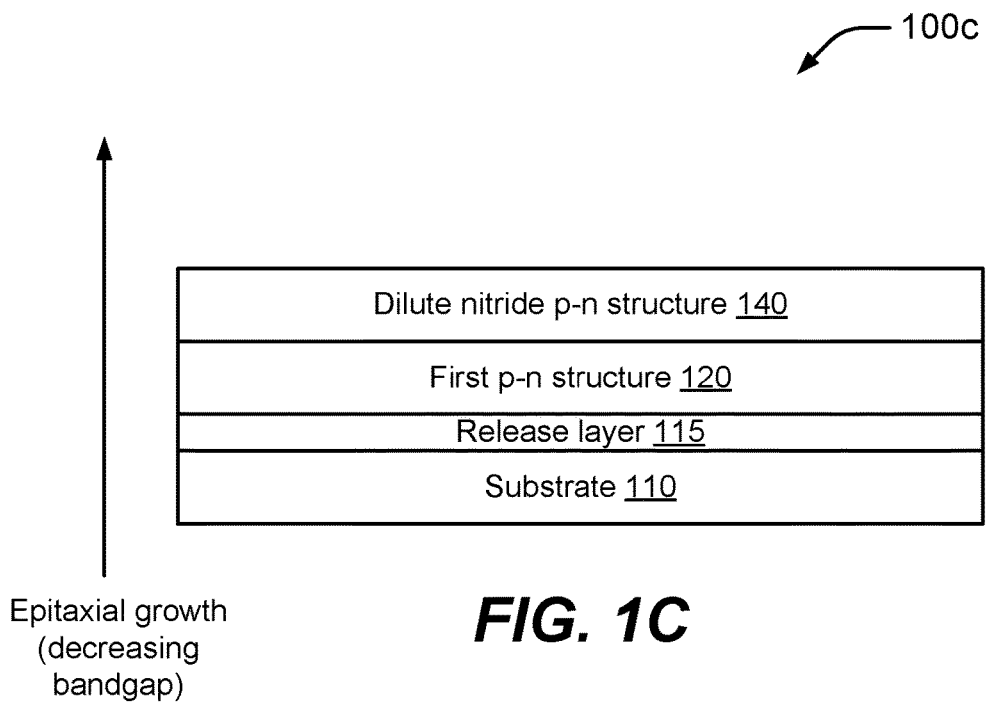
FIGS. 1C and 1D are diagrams that illustrate examples of a multi-junction optoelectronic device with 2 junctions (2J) or p-n structures (dual-junction device) with dilute nitride as a bottom junction in accordance with aspects of this disclosure.
Figure 1D:
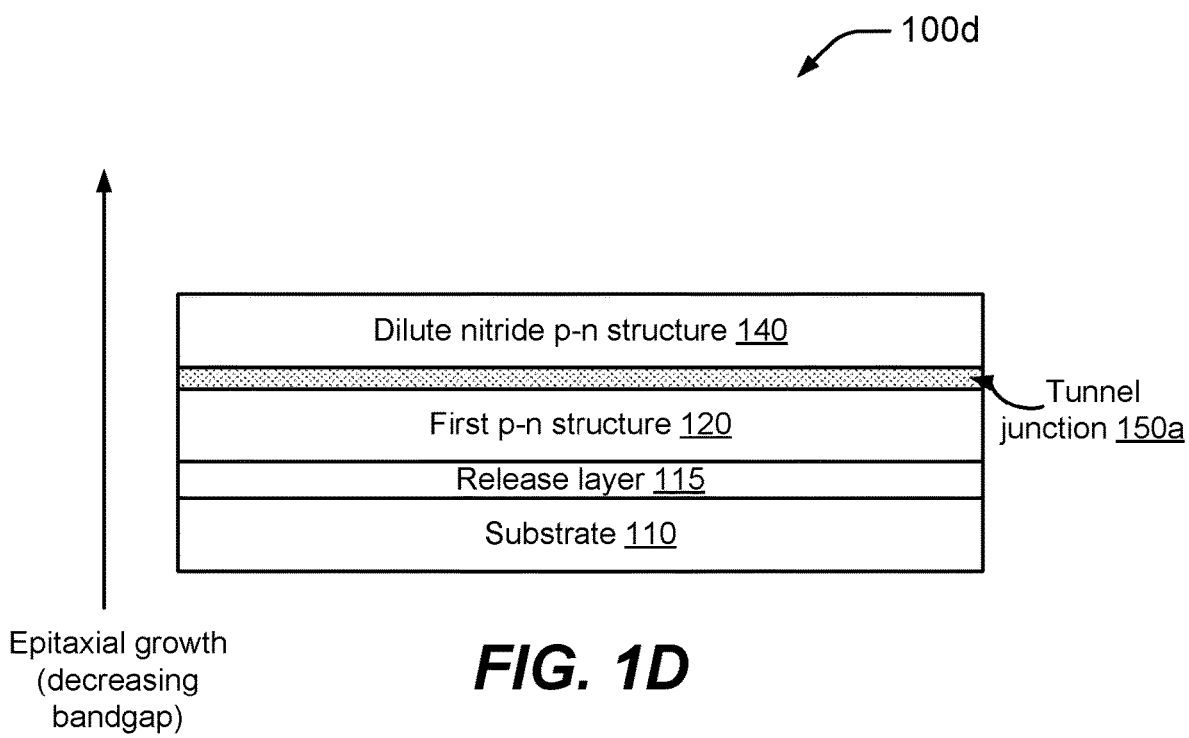

FIG. 1C shows a diagram 100c that illustrates a general example of a dual-junction optoelectronic device having the substrate 110, the release layer 115, the first p-n structure 120, and the dilute nitride p-n structure 140 described above in connection with FIG. 1A. Moreover, FIG. 1D shows a diagram 100*d* that illustrates the dual-junction optoelectronic device in FIG. 1C with an optional tunnel junction (e.g., tunnel junction 150*a*) provided between the p-n structures. The dual-junction optoelectronic devices in FIGS. 1C and 1D can be grown, structured, processed, and eventually lifted off using similar materials, processes, and techniques as described herein for other multi-junction optoelectronic devices. The bottom junction of the dual-junction with dilute nitride could employ back reflector and optical engineering for enhanced light absorption as described elsewhere in this application.

In an example of the dual-junction optoelectronic device, the first p-n structure 120 can be made of a group III-V semiconductor material such as AlGaInP, AlGaAs, or GaInAsP, and have a bandgap in the range 1.6 eV-1.8 eV, while the dilute nitride p-n structure 140 can be made of any of the dilute nitride alloys described herein and have a bandgap in the range 0.9 eV-1.2 eV.

As noted above, each of the structures described in FIGS. 1A, 1B, 1C, and 1D can be implemented with additional layers such as back reflectors and/or other optical engineered layers as described in more detail below with respect to FIGS. 7, 8, and 9.

Figure 2A:
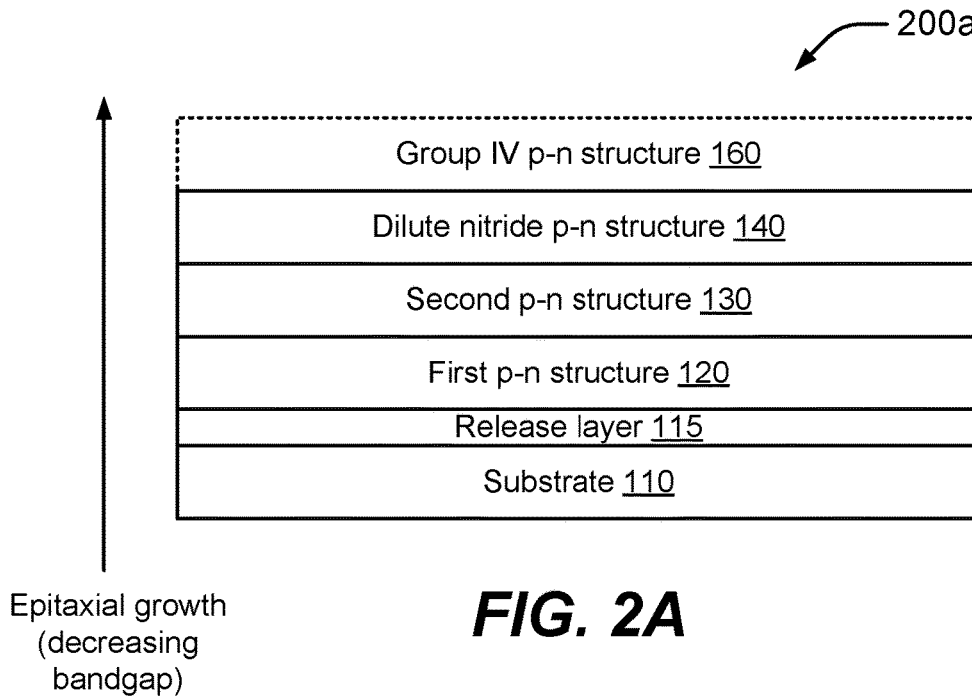
FIGS. 2A and 2B are diagrams that illustrate examples of a multi-junction optoelectronic device with dilute nitride and/or group IV semiconductor materials as bottom junctions in accordance with aspects of this disclosure.

FIG. 2A shows a diagram 200*a* that illustrates a general example of a multi-junction optoelectronic device with a dilute nitride p-n structure and a group IV semiconductor material p-n structure as bottom junctions. In this example, a group IV p-n structure 160 can be optionally grown or deposited (as illustrated by the dotted lines) on the dilute nitride p-n structure 140. As such, the dilute nitride p-n structure 140 is grown next to last and the group IV p-n structure 160 is grown last, making these two p-n structures the bottom junctions of the multi-junction optoelectronic device shown in the diagram 200*a*. In this example, like the example in FIG. 1A, the multi-junction optoelectronic device is epitaxially grown as sunny side down (e.g., side receiving light is grown first) with decreasing bandgap from the first p-n structure 120 to the optional group IV p-n structure 160.

The group IV p-n structure 160 can include epitaxially grown layers as thin films made of group IV semiconductor materials. The group IV p-n structure 160 can be formed by epitaxial growth using different from those used for the first p-n structure 120, the second p-n structure 130, and the dilute nitride p-n structure 140. For example, plasma enhanced chemical vapor deposition (PECVD), physical vapor deposition (PVD), or atmospheric pressure chemical vapor deposition (APCVD) may be used to form the group IV p-n structure 160. Other techniques that can be used to form the group IV p-n structure 160 include sputtering, atomic layer deposition (ALD), hydride vapor phase epitaxy (HVPE), metalorganic vapor phase epitaxy (MOVPE or OMVPE), metalorganic chemical vapor deposition (MOCVD), inductively coupled plasma enhanced chemical vapor deposition (ICP-CVD), hot-wire chemical vapor deposition (HWCVD), low pressure chemical vapor deposition (LPCVD), and other forms of chemical vapor deposition (CVD). In some implementations, the group IV p-n structure 160 is substantially a single crystal (e.g., the group IV p-n structure 160 can include a single-crystalline semiconductor material). To achieve this, the growth substrate 110 with the other p-n structures may be transferred to a different growth chamber to grow the group IV p-n structure 160 on top using another growth process such as PECVD, PVD, or APCVD. High growth rate deposition process may also be used to allow for growth rates of greater than 1 µm/hr, such as about 10 µm/hr or greater, or as high as about 100 µm/hr or greater. For example, the growth rates can be about 10 µm/hr, about 20 µm/hr, about 30 µm/hr, about 40 m/hr, about 50 µm/hr, about 60 µm/hr, about 70 µm/hr, about 80 µm/hr, about 90 µm/hr, or about 100 µm/hr, some specific rate between any two of these values (e.g., about 25 µm/hr—between 20 µm/hr and 30 µm/hr), or some range between any two of these values (e.g., range from about 20 µm/hr to about 30 µm/hr).). In some implementations, the high growth rate deposition process allows for growth rates of greater than 100 µm/hr, including growth rates of about 120 µm/hr.

In another aspect, the group IV p-n structure 160 can include multiple p-n junctions, just like the p-n structures described above in connection with FIG. 1A. Each p-n junction can contain various layers of group IV semiconductor materials, which can be grown using different source materials including, but not limited to, isobutylgermane, alkylgermanium trichlorides, dimethylaminogermanium trichloride, germane, silane, disilane, silicon tetrachloride, carbontetrabromide, carbontribromidechloride, etc. This list of precursors is not meant to be an exhaustive list, it could include any precursors that can be used to deposit alloys comprising of Si, Ge, Sn, C. In general, each p-n junction comprises a group IV semiconductor material and includes at least one of silicon, germanium, tin, and carbon, and mixtures of two or more of these materials.

Figure 2B:
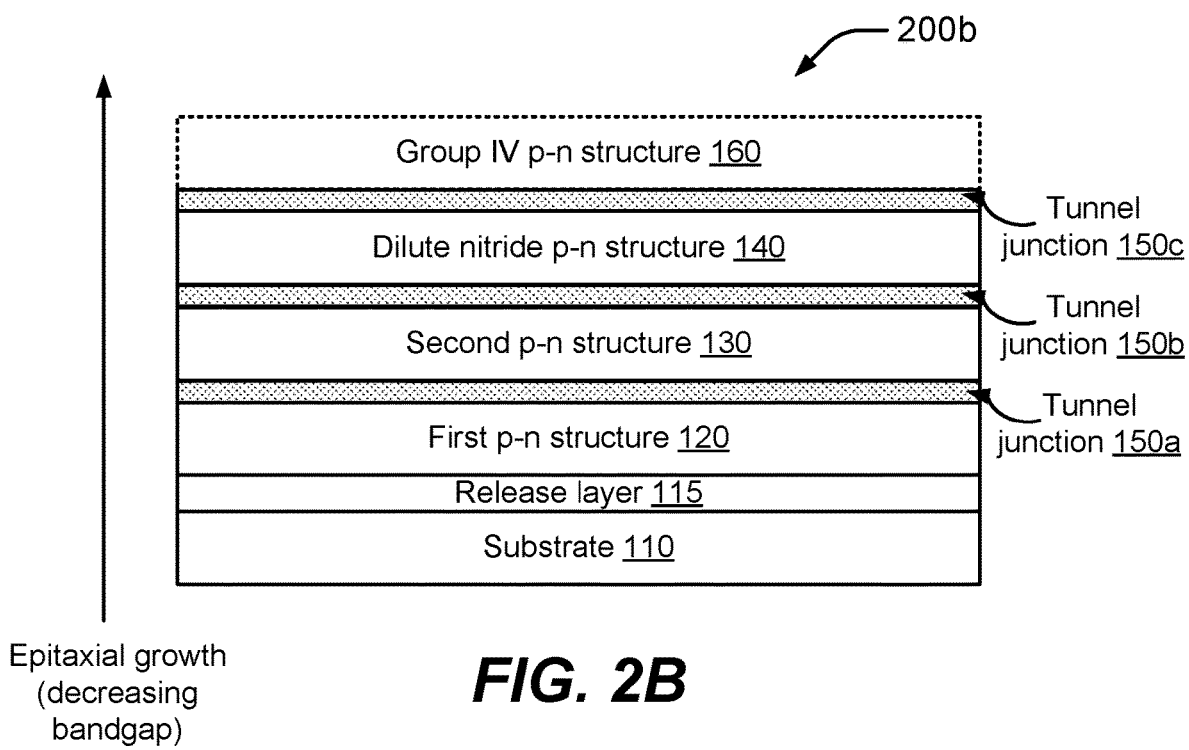

FIG. 2B shows a diagram 200*b* that illustrates the multi-junction optoelectronic device in FIG. 2A with optional tunnel junctions provided between the p-n structures. For example, in addition to the tunnel junctions 150*a* and 150*b* shown in FIG. 1B, a tunnel junction 150*c* is grown, deposited, or otherwise disposed between the dilute nitride p-n structure 140 and the group IV p-n structure 160.

While the tunnel junctions 150*a* and 150*b* can be grown based on group III-V semiconductor materials (e.g., GaAs, AlGaAs, or AlGaInP), the tunnel junction 150*c* can be grown based on group III-V semiconductor materials and/or group IV semiconductor materials.

Figure 3A:
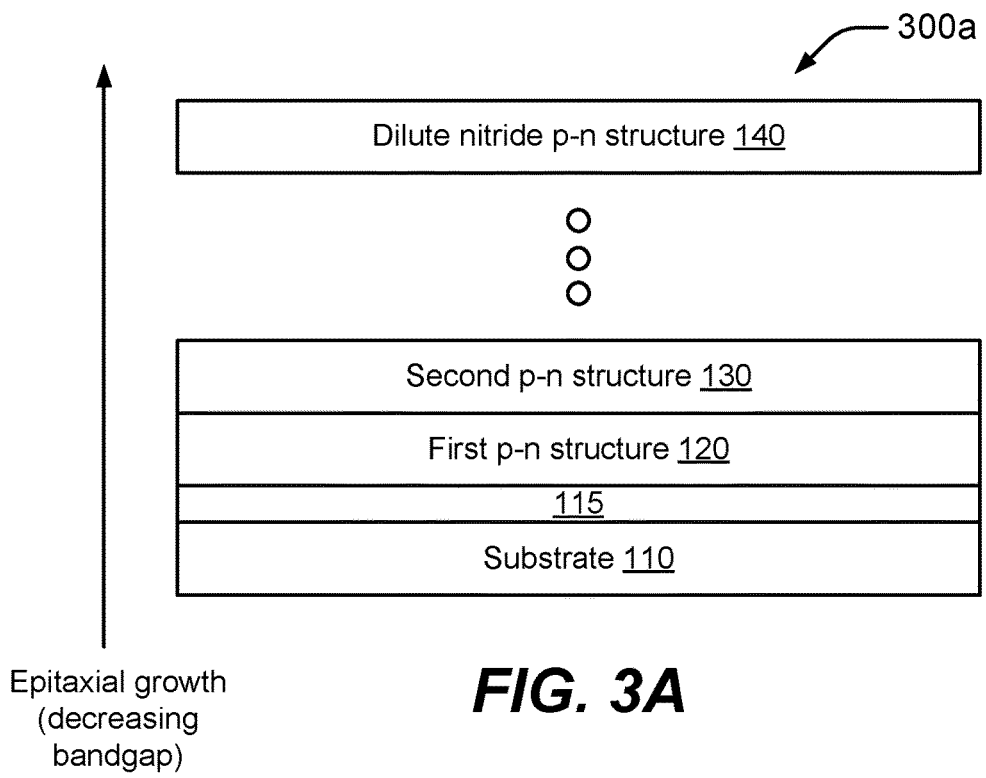
FIGS. 3A and 3B are diagrams that illustrate examples of a multi-junction optoelectronic device with 4 or more junctions (4J+) or p-n structures with dilute nitride as a bottom junction in accordance with aspects of this disclosure.

FIG. 3A shows a diagram 300*a* that illustrate a general example of a multi-junction optoelectronic device with four or more (4+) junctions or p-n structures (e.g., a 4J+ multi-junction optoelectronic device). In this example, in addition to the substrate 110, the release layer 115, the first p-n structure 120, the second p-n structure 130, and the dilute nitride p-n structure 140, there may be one or more additional p-n structures grown between the second p-n structure 130 and the dilute nitride p-n structure 140. Overall, the multi-junction optoelectronic device in FIG. 3A can have four (4) p-n structures/junctions (4J multi-junction optoelectronic device), five (5) p-n structures/junctions (5J multi-junction optoelectronic device), or more than five p-n structures/junctions, for example. The multi-junction optoelectronic device in this example is also epitaxially grown as sunny side down (e.g., side receiving light is grown first) with decreasing bandgap from the first p-n structure 120 to the dilute nitride p-n structure 140. That is, the one or more additional p-n structures would be made of lattice-matched materials having a bandgap smaller than that of the material(s) from which the second p-n structure 130 is made while having a bandgap larger than that of the material(s) from which the dilute nitride p-n structure is made.

The one or more additional p-n structures can be made of group III-V semiconductor materials and using the same or similar techniques to those described above in connection with the first p-n structure 120 and the second p-n structure 130. Moreover, like the first p-n structure 120 and the second p-n structure 130, the one or more additional p-n structures can include one or more p-n junctions within.

Figure 3B:
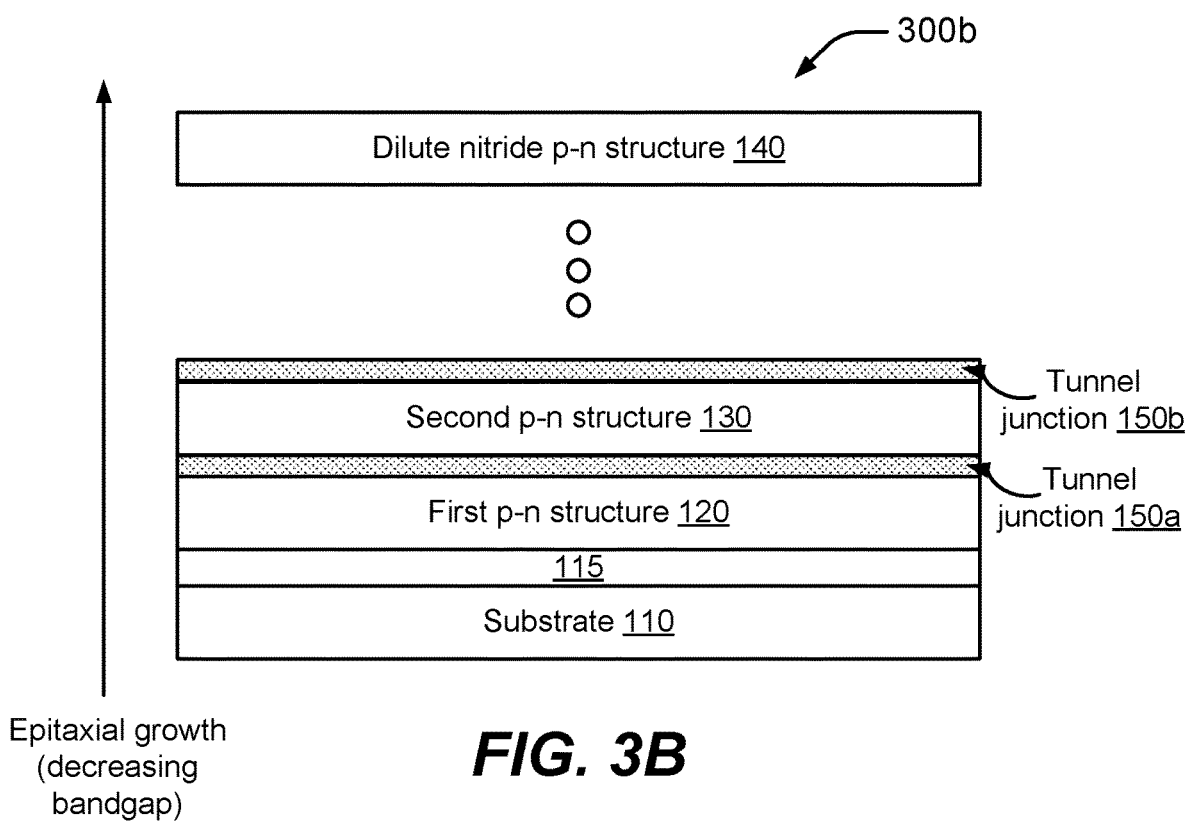

FIG. 3B shows a diagram 300b that illustrates the multi-junction optoelectronic device in FIG. 3A with optional tunnel junctions provided between the p-n structures. In this example, in addition to the tunnel junctions 150a and 150b, other tunnel junctions may be provided because of the one or more additional p-n structures formed between the second p-n structure 130 and the dilute nitride p-n structure 140.

Figure 4A:
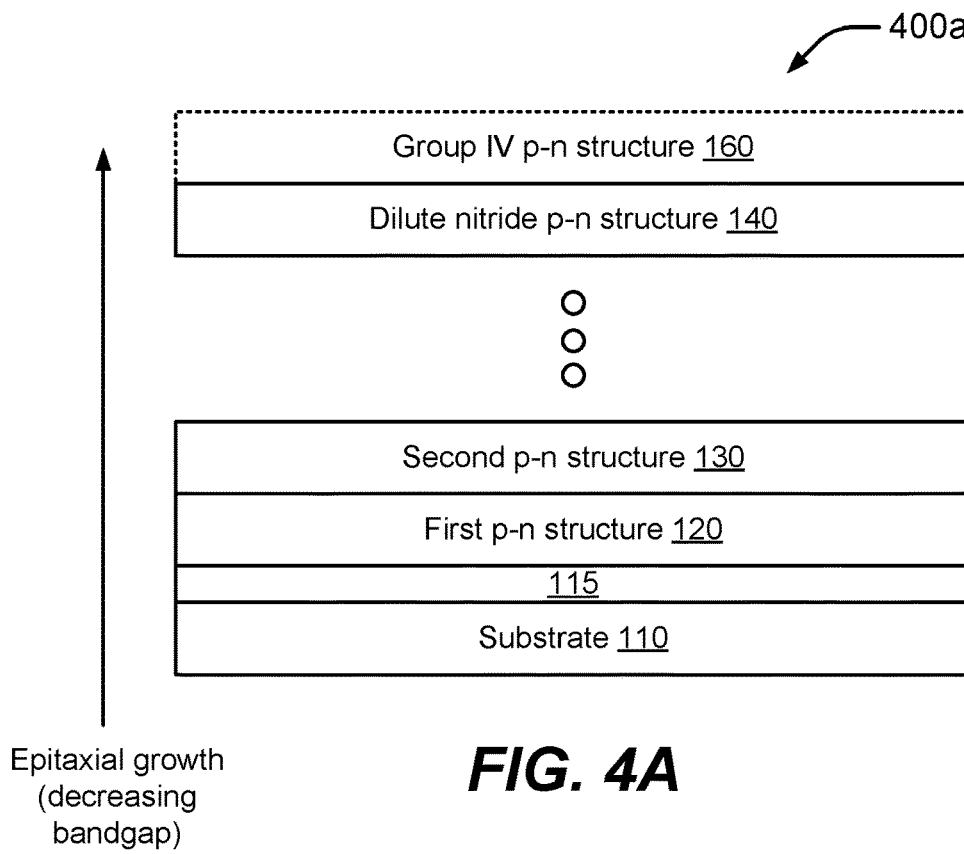
FIGS. 4A and 4B are diagrams that illustrate examples of a multi-junction optoelectronic device with 4 or more junctions (4J+) or p-n structures with dilute nitride and/or group IV semiconductor materials as bottom junctions in accordance with aspects of this disclosure.
Figure 4B:
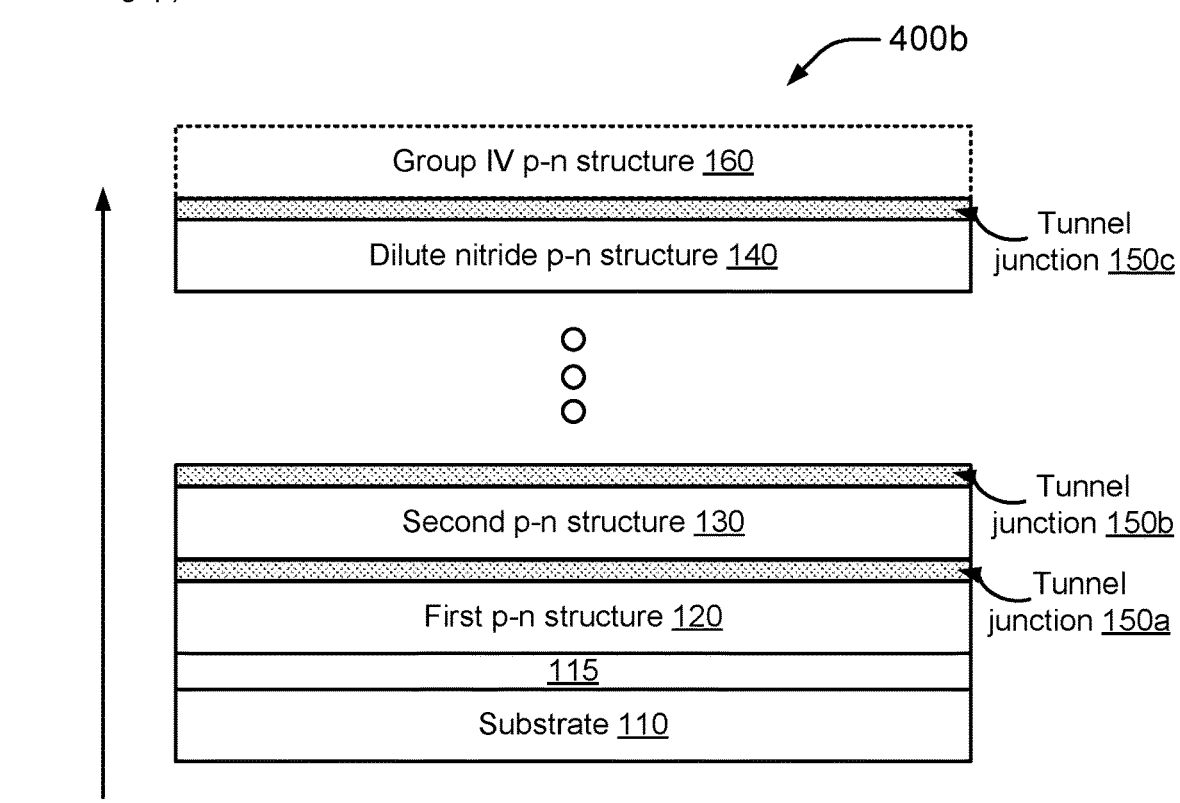

FIGS. 4A and 4B respectively show diagrams 400a and 400b that illustrate the multi-junction optoelectronic devices in FIG. 3A (not showing tunnel junctions) and FIG. 3B (showing tunnel junctions) with the optional group IV p-n structure 160 grown or deposited on the dilute nitride p-n structure 140.

Figure 5A:
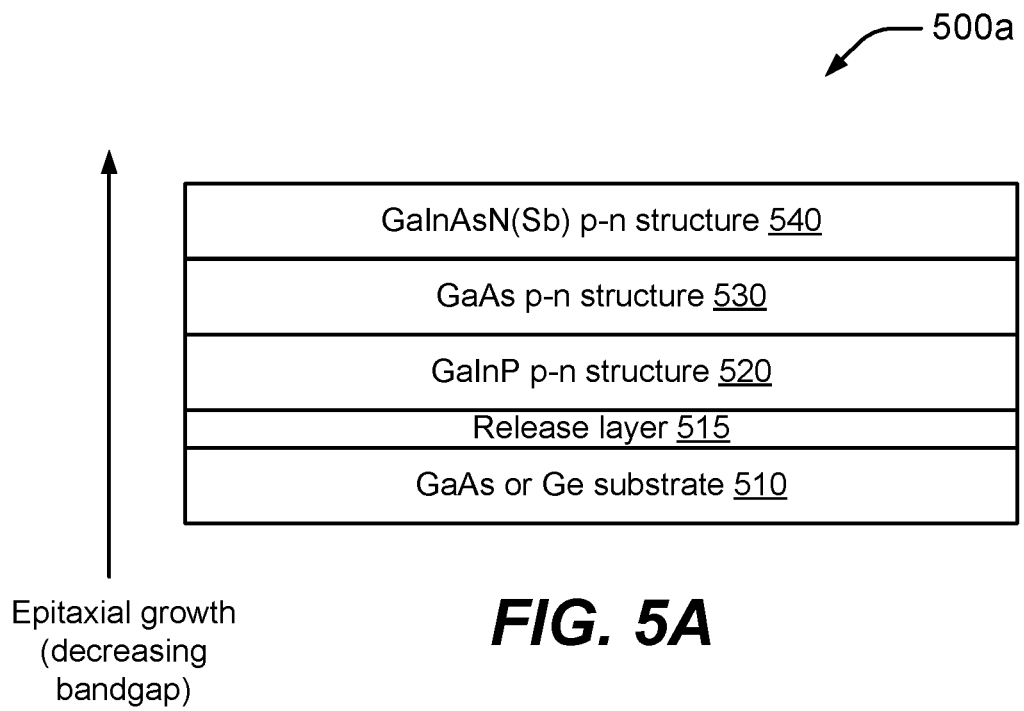
FIGS. 5A and 5B are diagrams that illustrate a specific configuration for a multi-junction optoelectronic device with 3 junctions (3J) or p-n structures with dilute nitride as the bottom junction and separation from the substrate in accordance with aspects of this disclosure.

FIG. 5A shows a diagram 500a that illustrates a specific configuration for a multi-junction optoelectronic device with three (3) p-n structures/junctions, with a dilute nitride p-n structure/junction as a bottom junction.

In a first example, the multi-junction optoelectronic device in FIG. 5A includes a substrate that is made of GaAs or Ge (referred to as the GaAs or Ge substrate 510 in the diagram 500a), a release layer 515 substantially similar to the release layer 115 described above, and a first p-n structure that is made of GaInP with a bandgap of approximately 1.75 eV-1.95 eV (referred to as a GaInP p-n structure 520 in the diagram 500a). The multi-junction optoelectronic device also includes two additional p-n structures grown or deposited on the GaInP p-n structure 520. The additional p-n structures include a second p-n structure formed after the GaInP p-n structure 520 and made of GaAs, with a bandgap of approximately 1.4 eV (referred to as a GaAs p-n structure 530 in the diagram 500a), and a third p-n structure formed after the GaAs p-n structure 530, the third p-n structure being the last of the additional p-n structures and made of dilute nitride with a bandgap of approximately 0.9 eV-1.1 eV (referred to as a GaInAsN(Sb) p-n structure 540).

In a second example, the multi-junction optoelectronic device in FIG. 5A includes the GaAs or Ge substrate 510, the release layer 515, the GaInP p-n structure 520 made of AlGaInP and with a bandgap of approximately 1.75 eV-1.95 eV, the GaAs p-n structure 530 made of GaAs, AlInGaAs, or GaInAsP, and with a bandgap of approximately 1.3 eV-1.5 eV, and the GaInAsN(Sb) p-n structure 540 made of dilute nitride with a bandgap of approximately 0.9 eV-1.1 eV.

Figure 5B:
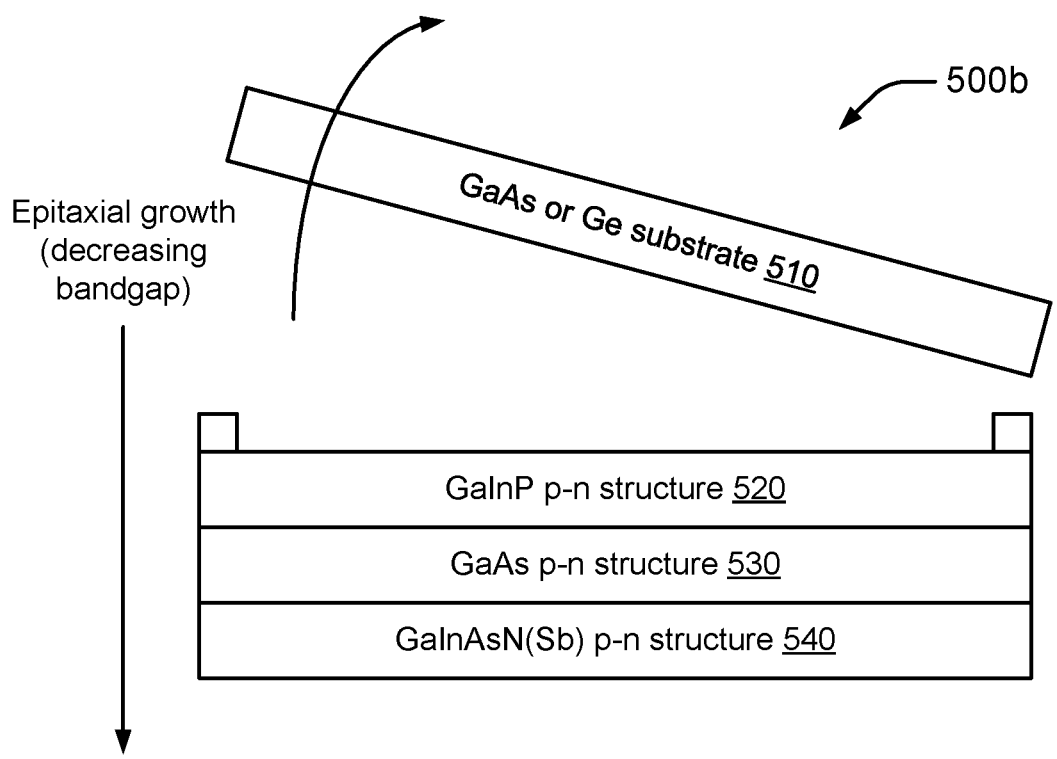

FIG. 5B shows a diagram 500b that illustrates a separation of the multi-junction optoelectronic device in FIG. 5A from the substrate 510 using any of different lift off techniques described herein, including an ELO process, for example. The diagram 500b shows the stack of layers from FIG. 5A sunny side up (e.g., side receiving light at the top) with the GaAs or Ge substrate 510 being removed or separated from the multi-junction optoelectronic device, which has a configuration with a decreasing bandgap from the GaInP p-n structure 520 (top junction) down to the GaInAsN(Sb) p-n structure 540 (the bottom junction).

Each of the structures described in FIGS. 5A and 5B can be implemented with additional layers such as back reflectors and/or other optical engineered layers as described in more detail below with respect to FIGS. 7, 8, and 9.

Figure 6A:
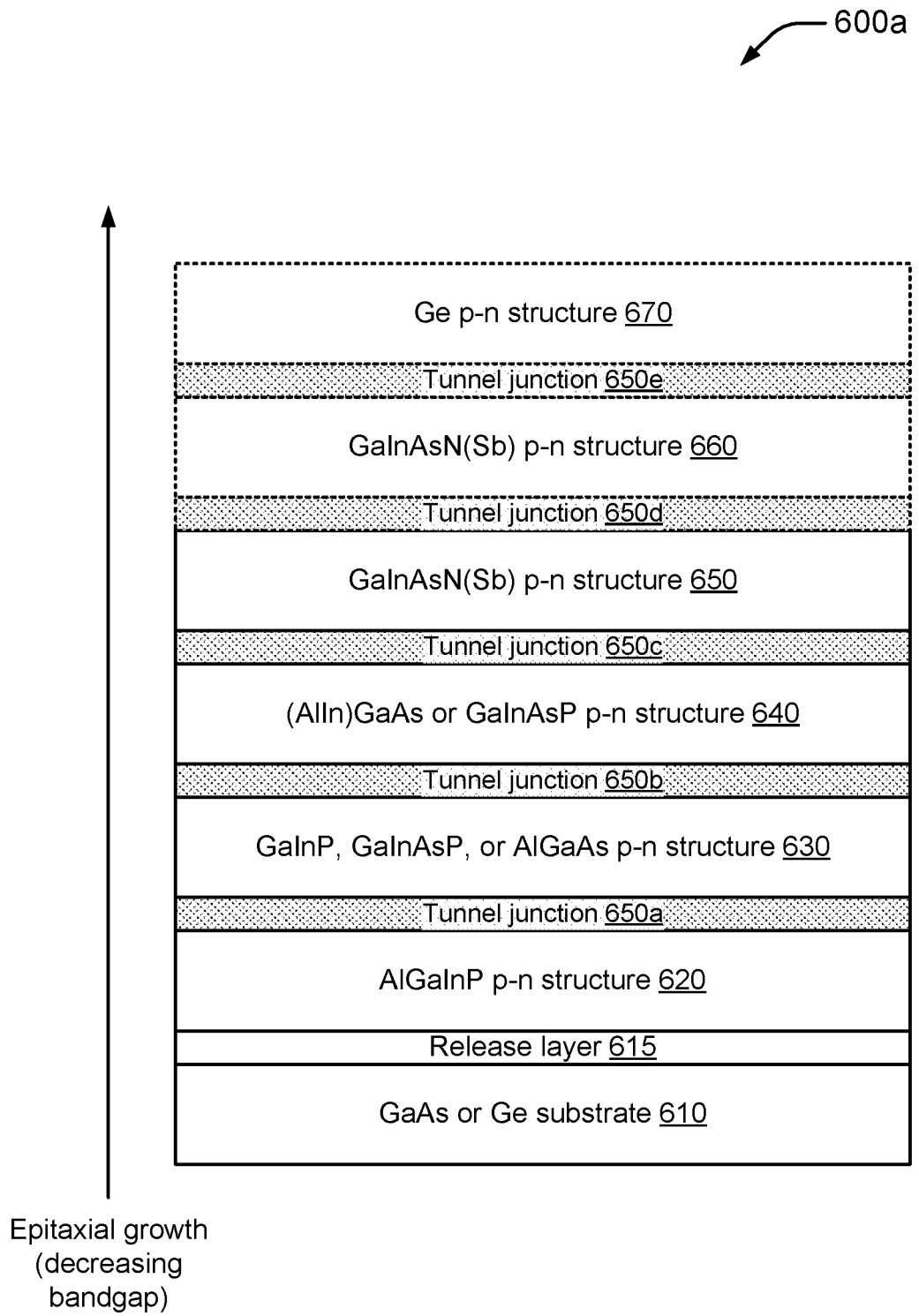
FIGS. 6A and 6B are diagrams that illustrate a specific configuration for a multi-junction optoelectronic device with dilute nitrides and/or group IV semiconductor materials as bottom junctions and separation from the substrate in accordance with aspects of this disclosure.

FIG. 6A shows a diagram 600a that illustrates a specific configuration for a multi-junction optoelectronic device with multiple p-n structures/junctions, with a dilute nitride p-n structure/junction as a bottom junction, or optionally, with a dilute nitride p-n structure/junction and a group IV p-n structure/junction as the bottom junctions.

In this example, the multi-junction optoelectronic device in FIG. 6A includes a substrate that is made of GaAs or Ge (referred to as the GaAs or Ge substrate 610 in the diagram 600a), a release layer 615 substantially similar to the release layer 115 described above, and a first p-n structure that is made of AlGaInP with a bandgap of approximately of approximately 2.0 eV-2.2 eV (referred to as a AlGaInP p-n structure 620 in the diagram 600a).

The multi-junction optoelectronic device in FIG. 6A also includes at least three additional p-n structures. For example, the multi-junction optoelectronic device includes a second p-n structure formed after the AlGaInP p-n structure 620 and made of GaInP, GaInAsP, or AlGaAs, with a bandgap of approximately 1.6 eV-1.9 eV (referred to as the GaInP, GaInAsP, or AlGaAs p-n structure 630 in the diagram 600a).

The multi-junction optoelectronic device also includes a third p-n structure formed after the GaInP, GaInAsP, or AlGaAs p-n structure 630 and made of GaAs, AlInGaAs, or GaInAsP, with a bandgap of approximately 1.3 eV-1.5 eV (referred to as the (AlIn)GaAs or GaInAsP p-n structure 630 in the diagram 600a).

The multi-junction optoelectronic device also includes a fourth p-n structure formed after the (AlIn)GaAs or GaInAsP p-n structure 630, where the fourth p-n structure is the last of the additional p-n structures and is made of a dilute nitride with a bandgap of approximately 1.1 eV-1.3 eV (referred to as a GaInAsN(Sb) p-n structure 650 in the diagram 600a).

Each of the AlGaInP p-n structure 620, the GaInP, GaInAsP, or AlGaAs p-n structure 630, the (AlIn)GaAs or GaInAsP p-n structure 640, and the GaInAsN(Sb) p-n structure 650 are lattice-matched to the GaAs or Ge substrate 610.

Optionally (as illustrated by the dotted line), the multi-junction optoelectronic device can also include a fifth p-n structure on the GaInAsN(Sb) p-n structure 650, where the fifth p-n structure is lattice-matched to the GaAs or Ge substrate 610 and is made of a dilute nitride with a bandgap of approximately 0.8 eV-1.1 eV (referred to as the GaInAsN (Sb) p-n structure 660 in the diagram 600a). In this case, the GaInAsN(Sb) p-n structure 660 is considered the last of the additional p-n structures.

Optionally (as illustrated by the dotted line), the multi-junction optoelectronic device can also include a sixth p-n structure on the GaInAsN(Sb) p-n structure 660, where the sixth p-n structure is lattice-matched to the GaAs or Ge substrate 610 and is made of Ge with a bandgap of approximately 0.7 eV (referred to as the Ge p-n structure 670 in the diagram 600a).

Also shown in the diagram 600a are multiple tunnel junctions between the p-n structures. For example, there is optionally a tunnel junction 650a between the AlGaInP p-n structure 620 and the GaInP, GaInAsP, or AlGaAs p-n structure 630. There is also optionally a tunnel junction 650b between the GaInP, GaInAsP, or AlGaAs p-n structure 630 and the (AlIn)GaAs or GaInAsP p-n structure 640. There is also optionally a tunnel junction 650c between the (AlIn) GaAs or GaInAsP p-n structure 640 and the GaInAsN(Sb) p-n structure 650. There is also optionally a tunnel junction 650d between the GaInAsN(Sb) p-n structure 650 and the GaInAsN(Sb) p-n structure 660. Moreover, there is also optionally a tunnel junction 650e between the GaInAsN(Sb) p-n structure 660 and the Ge p-n structure 670. Each of the tunnel junctions 650a-650e can be made of AlGaAs, GaAs, or AlGaInP, for example.

Figure 6B:
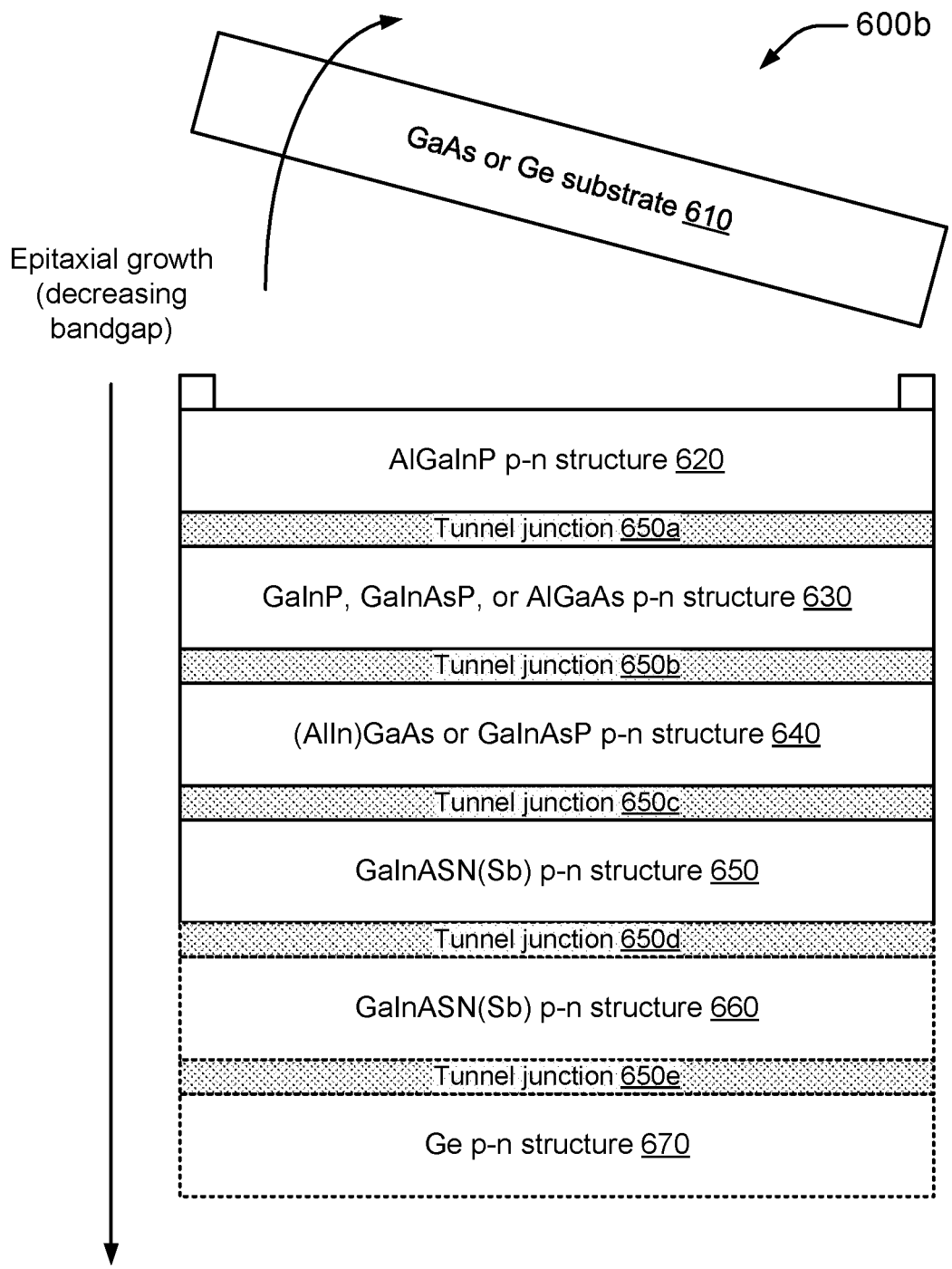

FIG. 6B shows a diagram 600b that illustrates a separation of the multi-junction optoelectronic device in FIG. 6A from the GaAs or Ge substrate 610 using any of different lift off techniques described herein, including an ELO process, for example. The diagram 500b shows the stack of layers from FIG. 5A sunny side up (e.g., side receiving light at the top) with the GaAs or Ge substrate 510 being removed or separated from the multi-junction optoelectronic device, which has a first configuration (4J configuration) with a decreasing bandgap from the AlGaInP p-n structure 620 (top junction) down to the GaInAsN(Sb) p-n structure 650 (the bottom junction), or a second configuration (5J configuration) with a decreasing bandgap from the AlGaInP p-n structure 620 (top junction) down to the GaInAsN(Sb) p-n structure 660 (the bottom junction), or a third configuration (6J configuration) with a decreasing bandgap from the AlGaInP p-n structure 620 (top junction) down to the GaInAsN(Sb) p-n structure 650 (next to the bottom junction) and the Ge p-n structure 670 (the bottom junction).

Figure 7:
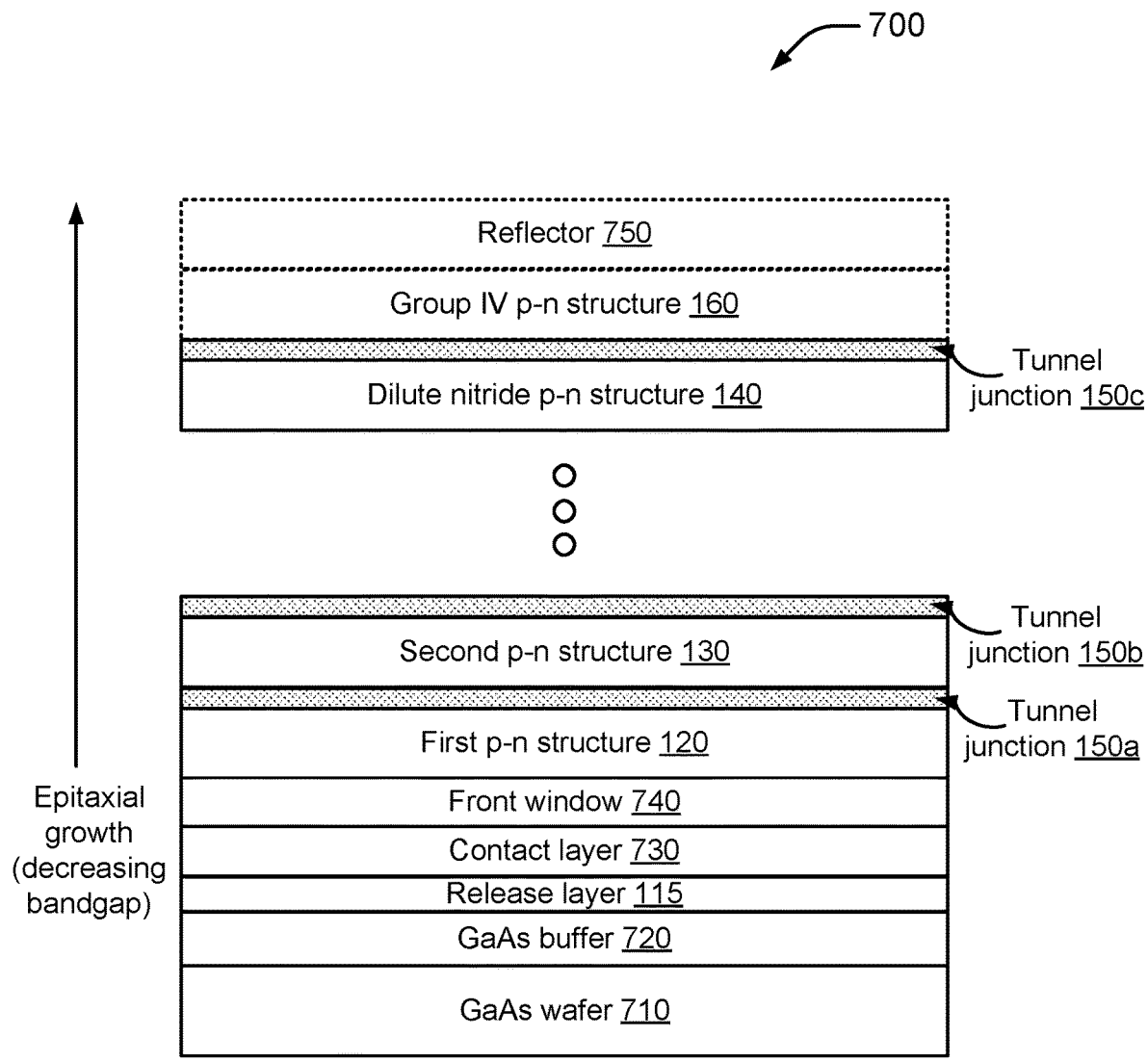
FIGS. 7, 8, and 9 are diagrams that illustrate examples of a multi-junction optoelectronic device with dilute nitrides and/or group IV semiconductor materials as bottom junctions in accordance with aspects of this disclosure.

FIG. 7 shows a diagram 700 that illustrates another general example of a multi-junction optoelectronic device. In this example, there is a GaAs wafer 710 that corresponds to the substrate 110 when made of GaAs. A GaAs buffer 720 is disposed on the GaAs wafer 710, and the release layer 115 is disposed on the GaAs buffer 720. A contact layer 730 is formed on the release layer 115 and a front window 740 is formed on the contact layer 730.

The contact layer 730 can be heavily n-doped. In some implementations, the doping concentration can be within a range greater than about $5 \times 10^{18}$ cm$^{-3}$, for example, from greater than about $5 \times 10^{18}$ cm$^{-3}$ to about $5 \times 10^{19}$ cm$^{-3}$. The high doping of the contact layer 730 allows an ohmic contact to be formed with a later-deposited metal layer without any annealing step performed to form such an ohmic contact.

The contact layer 730 can be GaAs doped with silicon (Si). For example, in some implementations in which a high-growth rate, as described above, is used to form the layers of the multi-junction optoelectronic device, a silicon dopant (as an n-dopant) can be used to bring the doping concentration to $5 \times 10^{18}$ cm$^{-3}$ or greater. For example, a precursor disilane can be introduced in a fast growth rate process to deposit the silicon dopant. In other implementations, selenium (Se) or tellurium (Te) can be used as a dopant in the formation of at least some of the layers of multi-junction optoelectronic device.

In the example shown in the diagram 700, the contact layer 730 is formed before the multi-junction optoelectronic device is removed or separated from the GaAs wafer 710 and the GaAs buffer 720. The remaining portions of the structure shown include the same or similar layers as described above in connection with FIGS. 4A and 4B. For example, the first p-n structure 120 is formed on the front window 740, the second p-n structure 130 is formed on the first p-n structure 120, the dilute nitride p-n structure 140 is formed on the second p-n structure 130, and optionally, the group IV p-n structure 160 is formed on the dilute nitride p-n structure 140. Moreover, one or more additional p-n structures can be formed between the second p-n structure 130 and the dilute nitride p-n structure 140. Also optionally, the tunnel junctions 150a, 150b, and 150c can be formed between their respective p-n structures to provide electrical coupling.

A reflector 750 (also referred to as a back reflector) and/or other optically engineered layers may be formed on the bottom dilute nitride p-n structure 140 or the group IV p-n structure 160 (when present), for example.

A support layer (not shown) can be deposited on the last grown p-n structure either before or after the multi-junction optoelectronic device (e.g., from the contact layer 730 to the dilute nitride p-n structure 140 or the optional group IV p-n structure 160) is separated from the GaAs wafer 710. When deposited before the separation, the multi-junction optoelectronic device and the support layer can be lifted off (e.g., separated, removed) together from the GaAs wafer 710 and the GaAs buffer 720.

The support layer can include one or more of a dielectric layer, a semiconductor contact layer (or simply contact layer), a passivation layer, a transparent conductive oxide layer, an anti-reflective coating, a metal coating, an adhesive layer, an epoxy layer, or a plastic coating. In an embodiment or implementation, the support layer is composed of one or more materials that have a chemical resistance to acids, for example, to acids that are used as part of a liftoff process (e.g., ELO). In those instances in which a dielectric layer is included as part of a support layer, the dielectric layer includes dielectric materials that are organic or inorganic. The organic dielectric materials comprise any of polyolefin, polycarbonate, polyester, epoxy, fluoropolymer, derivatives thereof and combinations thereof and the inorganic dielectric materials comprise any of arsenic trisulfide, arsenic selenide, at alumina (sapphire), magnesium fluoride, derivatives thereof and combinations thereof. In those instances in which a contact layer (or multiple contact layers) is included as part of a support layer, the contact layer can contain group III-V semiconductor materials, such as GaAs, depending on the desired composition of the final multi-junction optoelectronic device.

Figure 8:
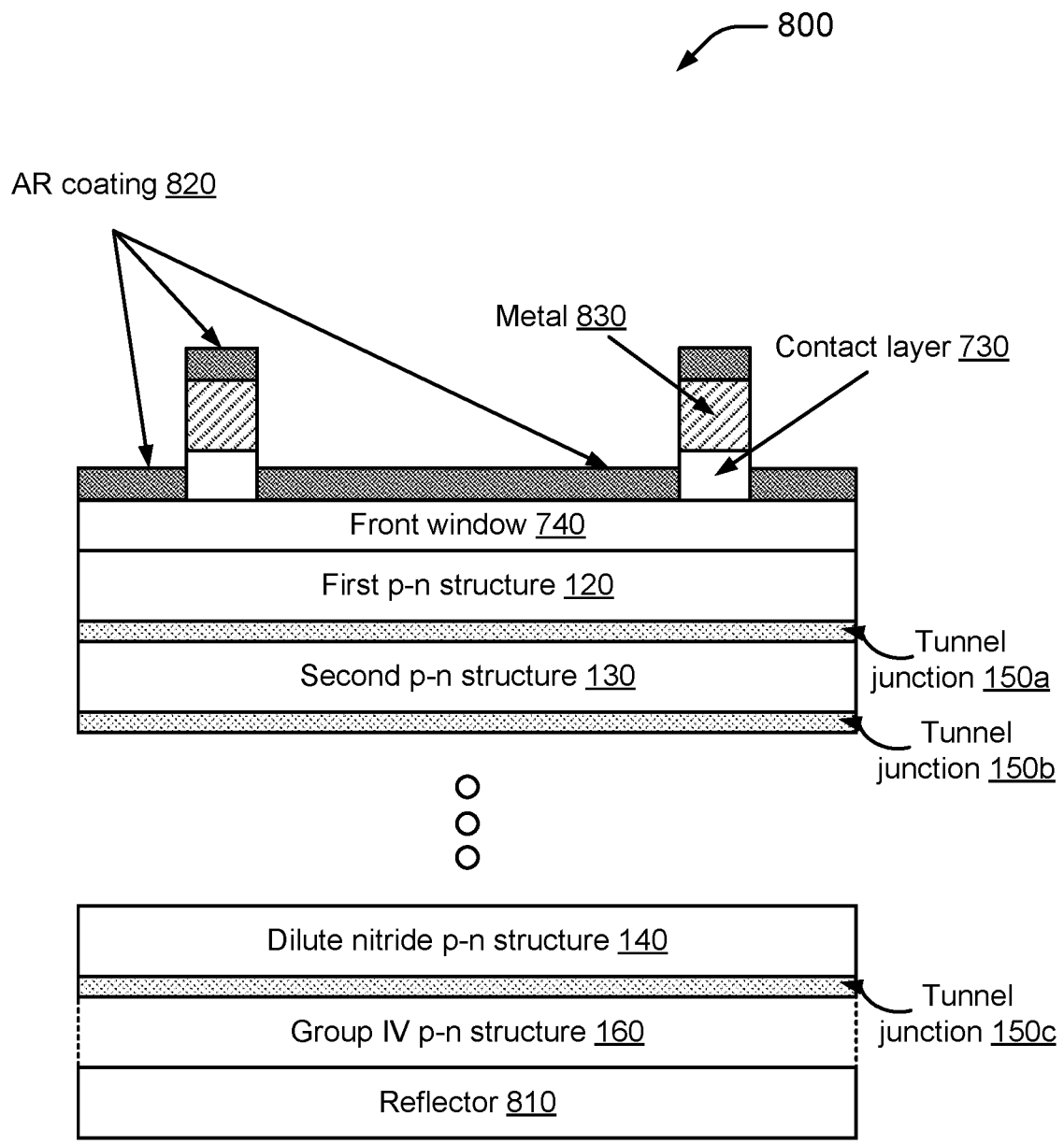

FIG. 8 shows a diagram 800 that illustrates the multi-junction optoelectronic device in FIG. 7 after being separated from the GaAs wafer 810 and the GaAs buffer 720. In the diagram 800, the multi-junction optoelectronic device is shown sunny side up with a reflector 810 added on the back side and metal 830 and an anti-reflecting (AR) coating 820 added to the front side. The reflector 810 may correspond to the reflector 750 shown in FIG. 7.

The reflector 810, which can also be referred to as reflective back contact, is a metallic reflector or a metal-dielectric reflector. These reflective back contact can be deposited either before or after the multi-junction optoelectronic device is lifted off and can comprise one or more of silver, aluminum, gold, platinum, copper, nickel, molybdenum or alloys thereof. The layer with the reflective back contact can be deposited by a vapor deposition process, such as physical vapor deposition (PVD), sputtering, electron beam deposition (e-beam), ALD, CVD, PE-ALD, or PE-CVD, or by other deposition processes including inkjet printing, screen printing, evaporation, electroplating, electroless deposition (e-less), or combinations thereof.

Figure 9:
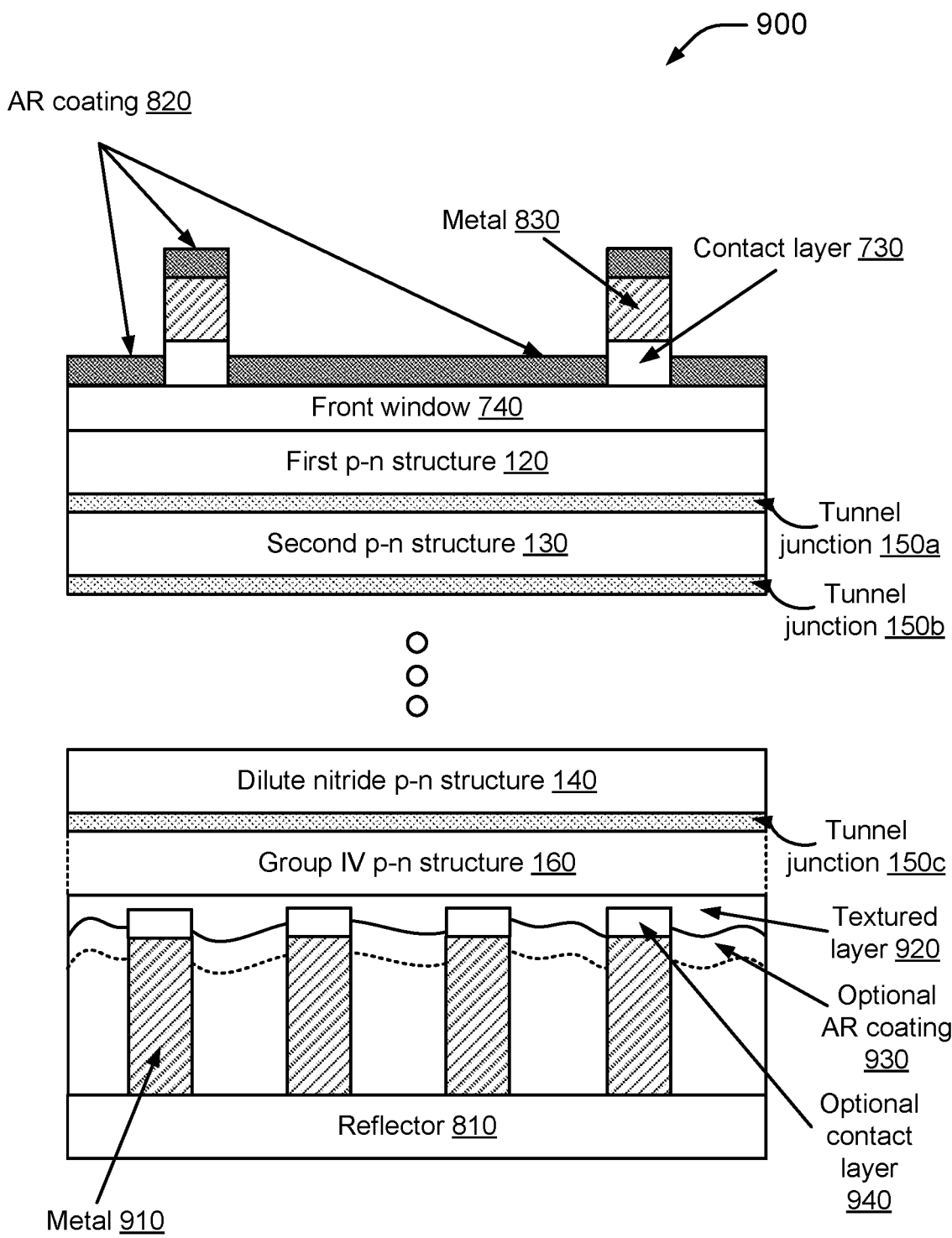

FIG. 9 shows a diagram 900 that illustrates the multi-junction optoelectronic device in FIG. 8 including the reflector 810 added on the back side and the metal 830 and the AR coating 820 added to the front side. In addition, between the reflector 810 and the dilute nitride p-n structure 140 (or the group IV p-n structure 160 if present), there is a textured layer 920, an optional AR coating 930 adjacent to the textured layer 920, one or more metals 910 in contact with the reflector 810, and optionally a contact layer 940 at the end of the one or more metals 940. Surface texturing, as provided by the textured layer 920 and/or the adjacent optional AR coating 930, can improve the scattering of light at that surface, as well as improve adhesion to both metal and dielectric layers.

Texturing associated with the multi-junction optoelectronic device need not be limited to the textured layer 920 and/or the optional adjacent AR coating 930. The texturing of a surface can be achieved during the growth of the materials that comprise a p-n structure. This can be achieved at least in part by using a lattice mismatch between at least two materials in the p-n structure, for example in a Stranski-Krastanov process or a Volmer-Weber process, to produce texturing at the interface between the materials. In another implementation, a layer in or on the p-n structure can act as an etch mask and texturing can be provided by an etching process. In yet another implementation, texturing can be provided by physical abrasion such as sandpaper or sandblasting or particle blasting or similar processes. In yet another implementation, texturing can be provided by an inhomogeneous wet or dry etching process that produces microscopically non-uniform features on a surface. Moreover, texturing can be accomplished using techniques similar to those used in silicon texturing, including, for example, "random pyramid" or "inverted pyramid" etching using, for example, KOH.

The back side (as in this example) and/or the front side (e.g., the side closest to where light is received by a photovoltaic cell or emitted by an LED) of the p-n structure can be textured to improve light scattering into and/or out of the device. In back-side texturing as shown in FIG. 9, the dilute nitride materials and/or the optional group IV semiconductor materials can be textured using one or more of the texturing techniques described above.

Figure 10:
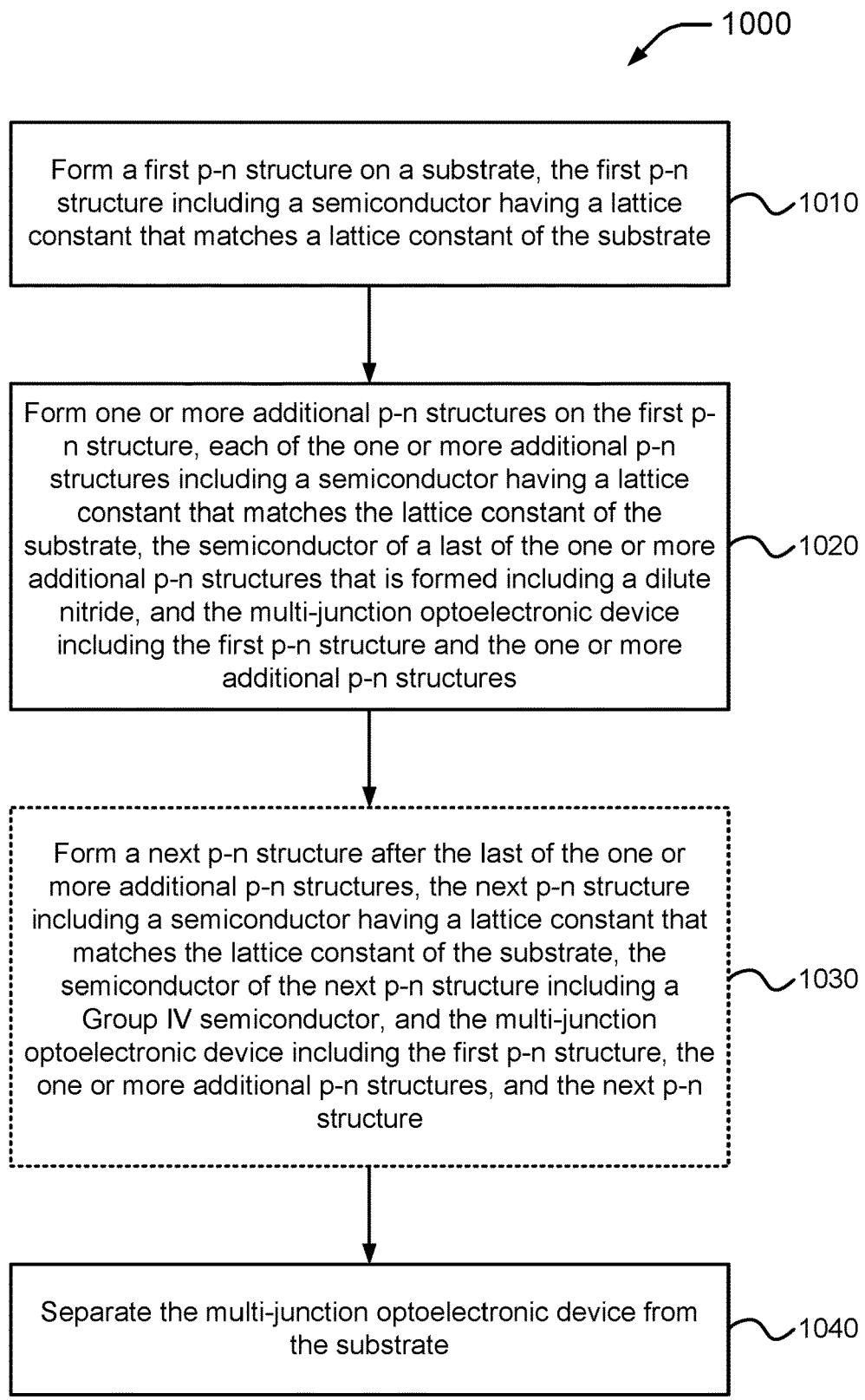
FIGS. 10, 11, and 12 are flow charts that illustrate examples of a method for fabricating a multi-junction optoelectronic in accordance with aspects of this disclosure.

FIG. 10 is a flow chart that illustrates a method 1000 for fabricating a multi-junction optoelectronic in accordance with aspects of this disclosure.

At block 1010, the method 1000 includes forming (e.g., epitaxially grow, deposit) a first p-n structure (e.g., the first p-n structure 120) on a substrate (e.g., the substrate 110), the first p-n structure including a semiconductor having a lattice constant that matches a lattice constant of the substrate.

At block 1020, the method 1000 includes forming one or more additional p-n structures (e.g., the second p-n structure 120, . . . , dilute nitride p-n structure 140) on the first p-n structure, each of the one or more additional p-n structures including a semiconductor having a lattice constant that matches the lattice constant of the substrate, the semiconductor of a last of the one or more additional p-n structures that is formed including a dilute nitride, and the multi-junction optoelectronic device including the first p-n structure and the one or more additional p-n structures.

At block 1030, the method 1000 optionally includes forming a next p-n structure after the last of the one or more additional p-n structures, the next p-n structure including a semiconductor having a lattice constant that matches the lattice constant of the substrate, the semiconductor of the next p-n structure including a group IV semiconductor (e.g., the group IV p-n structure 160), and the multi-junction optoelectronic device including the first p-n structure, the one or more additional p-n structures, and the next p-n structure. The group IV semiconductor of the next p-n structure includes one or more of Ge, Si, Sn, C, alloys thereof, or derivatives thereof.

At block 1040, the method 1000 includes separating the multi-junction optoelectronic device from the substrate (see e.g., FIGS. 5B, 6B).

In an aspect of the method 1000, forming the one or more additional p-n structures includes forming a second p-n structure after the first p-n structure, and forming a third p-n structure last.

In an aspect of the method 1000, forming the one or more additional p-n structures includes forming a second p-n structure after the first p-n structure, forming a third p-n structure after the second p-n structure, and forming a fourth p-n structure last.

In an aspect of the method 1000, forming the one or more additional p-n structures includes consecutively forming four or five p-n structures (e.g., without tunnel junctions).

In an aspect of the method 1000, the method further includes forming a tunnel junction between any two of the first p-n structure and the one or more additional p-n structures (see e.g., FIGS. 1B, 2B, 3B, 4B, 6A, 6B).

In an aspect of the method 1000, separating the multi-junction optoelectronic device from the substrate includes orienting the multi-junction optoelectronic device such that the first p-n structure is the one p-n structure nearest to the surface of the multi-junction optoelectronic device upon which light is to be incident and the last of the one or more additional p-n structures is the one p-n structure that is formed is farthest from that surface (e.g., orienting sunny side up).

In an aspect of the method 1000, the method further includes forming, as part of backside processing, additional layers on a surface of the multi-junction optoelectronic device nearest the last of the one or more additional p-n structures (see e.g., FIGS. 8 and 9).

In an aspect of the method 1000, the method further includes providing, for the multi-junction optoelectronic device, a support layer having one or more of a dielectric layer, a semiconductor contact layer, a passivation layer, a transparent conductive oxide layer, an anti-reflective coating, a metal coating, an adhesive layer, an epoxy layer, or a plastic coating to increase reflection of light back into the last p-n structure.

In an aspect of the method 1000, the substrate includes one of GaAs or Ge.

In an aspect of the method 1000, the semiconductor of the first p-n structure includes one or more of GaAs, AlGaAs, InGaP, InGaAs, AlInGaP, AlInGaAs, InGaAsP, AlInGaAsP, alloys thereof, or derivatives thereof.

In an aspect of the method 1000, the dilute nitride in the last of the one or more additional p-n structures that is formed includes one or more of GaInNAs, GaInNAsSb, alloys thereof, or derivatives thereof.

In an aspect of the method 1000, the dilute nitride includes $Ga_{1-y}In_yAs_{1-x-z}N_xSb_z$, where a concentration y of In is in the range of 0-20%, a concentration x of N is in the range of 0-6%, and a concentration z of Sb is in the range of 0-8%.

In an aspect of the method 1000, the lattice constant of the semiconductor of the last of the one or more additional p-n structures matches the lattice constant of the substrate with a mismatch or strain of <0.4%.

In an aspect of the method 1000, the semiconductor in each of the other of the one or more additional p-n structures includes one or more of GaAs, AlGaAs, InGaP, InGaAs, AlInGaP, AlInGaAs, InGaAsP, AlInGaAsP, alloys thereof, or derivatives thereof.

In an aspect of the method 1000, a bandgap of the semiconductor of the first p-n structure is greater than a bandgap of the dilute nitride in the last of the one or more additional p-n structures that is formed.

In an aspect of the method 1000, a bandgap of the semiconductor for each respective p-n structure decreases from the first p-n structure to the last of the one or more additional p-n structures.

In an aspect of the method 1000, forming the first p-n structure on the substrate includes disposing the first p-n structure using an epitaxial growth process, and forming the last of the one or more additional p-n structures includes disposing the last of the one or more additional p-n structures using the same epitaxial growth process used for the first p-n structure.

In an aspect of the method 1000, forming the first p-n structure on the substrate includes disposing the first p-n structure using a first epitaxial growth process, and forming the last of the one or more additional p-n structures includes disposing the last of the one or more additional p-n structures using a second epitaxial growth process different from the first epitaxial growth process. In one example, the first epitaxial growth process is performed in a first chamber, and the second epitaxial growth process is performed in a second chamber separate from the first chamber, which may or may not be connected to the first chamber. In another example, the first epitaxial growth process is a chemical vapor deposition (CVD) process, and the second epitaxial growth process is a molecular beam epitaxy (MBE) process.

In an aspect of the method 1000, any of the first p-n structure and the one or more additional p-n structures is provided by using an epitaxial growth process comprising one or more of a metalorganic chemical vapor deposition (MOCVD) process, a hydride vapor phase epitaxy (HVPE) process, a molecular beam epitaxy (MBE) process, a metalorganic vapor phase epitaxy (MOVPE or OMVPE) process, a liquid phase epitaxy (LPE) process, a close-space vapor transport (CSVT) epitaxy process, a plasma enhanced chemical vapor deposition (PECVD) process, a physical vapor deposition (PVD) process, an atmospheric pressure chemical vapor deposition (APCVD) process, an atomic layer deposition (ALD) process, a low pressure chemical vapor deposition (LPCVD) process, a hot-wire chemical vapor deposition (HWCVD) process, an inductively coupled plasma enhanced chemical vapor deposition (ICP-CVD) process, or other forms of CVD.

In an aspect of the method 1000, separating the multi-junction optoelectronic device from the substrate includes performing an ELO process for lifting the multi-junction optoelectronic device off the substrate.

In an aspect of the method 1000, the method further includes providing a release layer (e.g., the release layer 115) between the substrate and the first p-n structure, where separating the multi-junction optoelectronic device from the substrate includes removing the release layer. In an example, the sacrificial layer includes AlAs. In another example, the release layer includes AlGaAs, the concentration is $Al_xGa_{1-x}As$, where x=1 to 0.3. In yet another example, the release layer includes AlGaInP, the concentration is $(Al_xGa_{1-x})_{0.5}In_{0.5}P$, where x=1 to 0.

In an aspect of the method 1000, the substrate includes GaAs or Ge, the semiconductor of the first p-n structure includes AlGaInP with a bandgap of approximately 2.0 eV-2.2 eV, and the one or more additional p-n structures include: a second p-n structure formed after the first p-n structure and having a semiconductor including AlGaInP, GaInAsP, or AlGaAs, with a bandgap of approximately 1.6 eV-1.9 eV, a third p-n structure formed after the second p-n structure and having a semiconductor including GaAs, AlInGaAs, or GaInAsP, with a bandgap of approximately 1.3 eV-1.5 eV, and a fourth p-n structure formed after the third p-n structure, the fourth p-n structure being the last of the one or more additional p-n structures and having the dilute nitride with a bandgap of approximately 1.1 eV-1.3 eV (see e.g., FIG. 6A).

In an aspect of the method 1000, the method further includes forming a fifth p-n structure on the fourth p-n structure, the fifth p-n structure including a semiconductor having a lattice constant that matches the lattice constant of the substrate, the semiconductor of the fifth p-n structure including a dilute nitride with a bandgap of approximately 0.8 eV-1.1 eV (see e.g., FIG. 6A).

In an aspect of the method 1000, the method further includes forming a sixth p-n structure on the fifth p-n structure, the sixth p-n including a semiconductor having a lattice constant that matches the lattice constant of the substrate, the semiconductor of the fifth p-n structure including Ge with a bandgap of approximately 0.7 eV (see e.g., FIG. 6A).

In an aspect of the method 1000, the substrate includes GaAs or Ge, the semiconductor of the first p-n structure includes AlGaInP with a bandgap of approximately 1.75 eV-1.95 eV, and the one or more additional p-n structures include: a second p-n structure formed after the first p-n structure and having a semiconductor including GaAs, with a bandgap of approximately 1.4 eV, and a third p-n structure formed after the second p-n structure, the third p-n structure being the last of the one or more additional p-n structures and having the dilute nitride with a bandgap of approximately 0.9 eV-1.1 eV (see e.g., FIG. 5A).

In an aspect of the method 1000, the substrate includes GaAs or Ge, the semiconductor of the first p-n structure includes AlGaInP with a bandgap of approximately 1.75 eV-1.95 eV, and the one or more additional p-n structures include: a second p-n structure formed after the first p-n structure and having a semiconductor including GaAs, AlInGaAs, or GaInAsP, with a bandgap of approximately 1.3 eV-1.5 eV, and a third p-n structure formed after the second p-n structure, the third p-n structure being the last of the one or more additional p-n structures and having the dilute nitride with a bandgap of approximately 0.9 eV-1.1 eV (see e.g., FIG. 5A).

Figure 11:
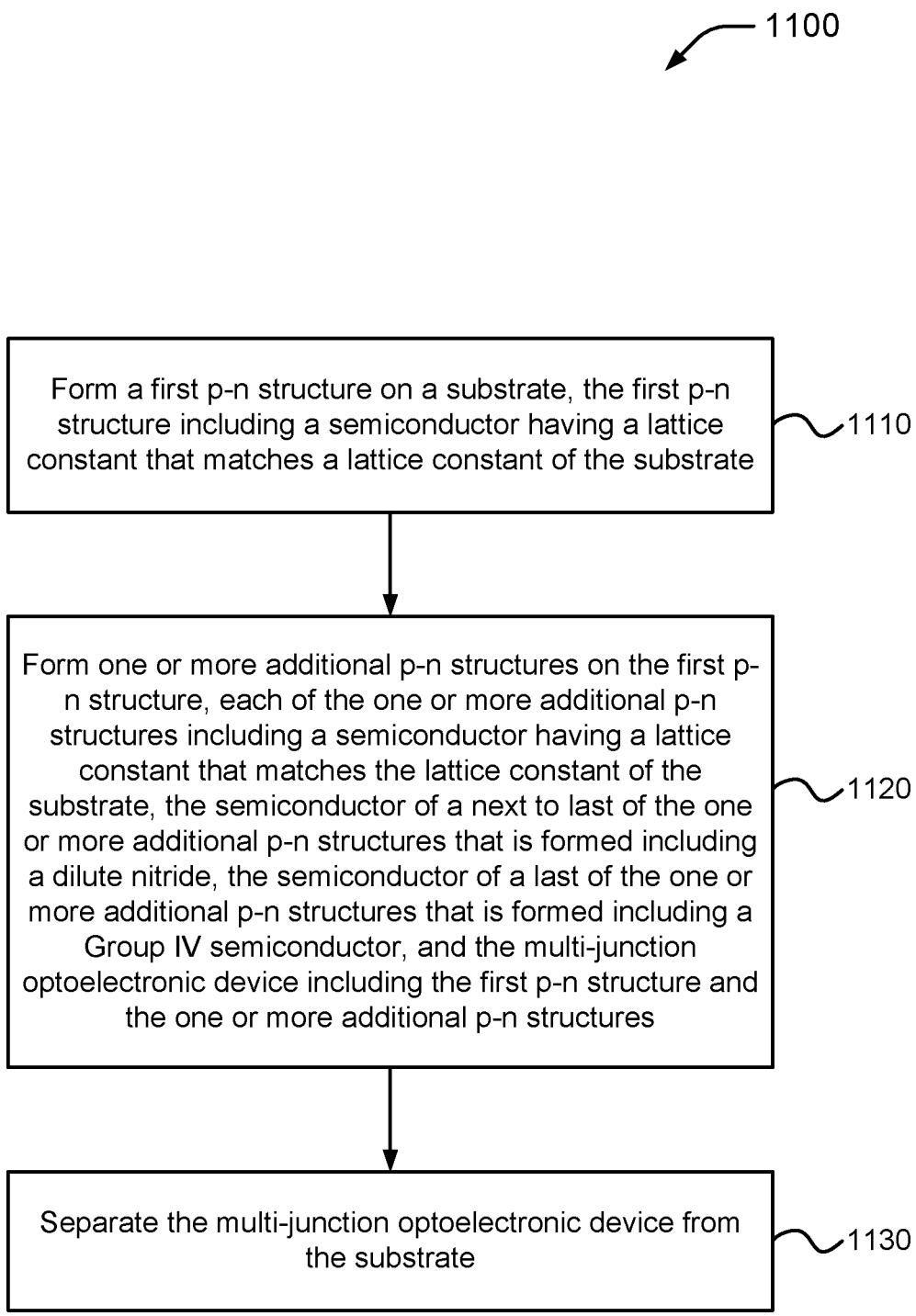

FIG. 11 is a flow chart that illustrates a method 1100 for fabricating a multi-junction optoelectronic in accordance with aspects of this disclosure.

At block 1110, the method 1100 includes forming a first p-n structure (e.g., the first p-n structure 120) on a substrate (e.g., the substrate 110), the first p-n structure including a semiconductor having a lattice constant that matches a lattice constant of the substrate.

At block 1120, the method 1100 includes forming one or more additional p-n structures on the first p-n structure, each of the one or more additional p-n structures including a semiconductor having a lattice constant that matches the lattice constant of the substrate, the semiconductor of a next to last of the one or more additional p-n structures that is formed including a dilute nitride (e.g., the dilute nitride p-n structure 140), the semiconductor of a last of the one or more additional p-n structures that is formed including a group IV semiconductor (e.g., the group IV p-n structure 160), and the multi-junction optoelectronic device including the first p-n structure and the one or more additional p-n structures.

At block 1130, the method 1100 includes separating the multi-junction optoelectronic device from the substrate.

In an aspect of the method 1100, the dilute nitride in the next to last of the one or more additional p-n structures that is formed includes one or more of GaInNAs, GaInNAsSb, alloys thereof, or derivatives thereof.

In an aspect of the method 1100, the group IV semiconductor of the last of the one or more additional p-n structures that is formed includes one or more of Ge, Si, Sn, C, alloys thereof, or derivatives thereof.

Figure 12:
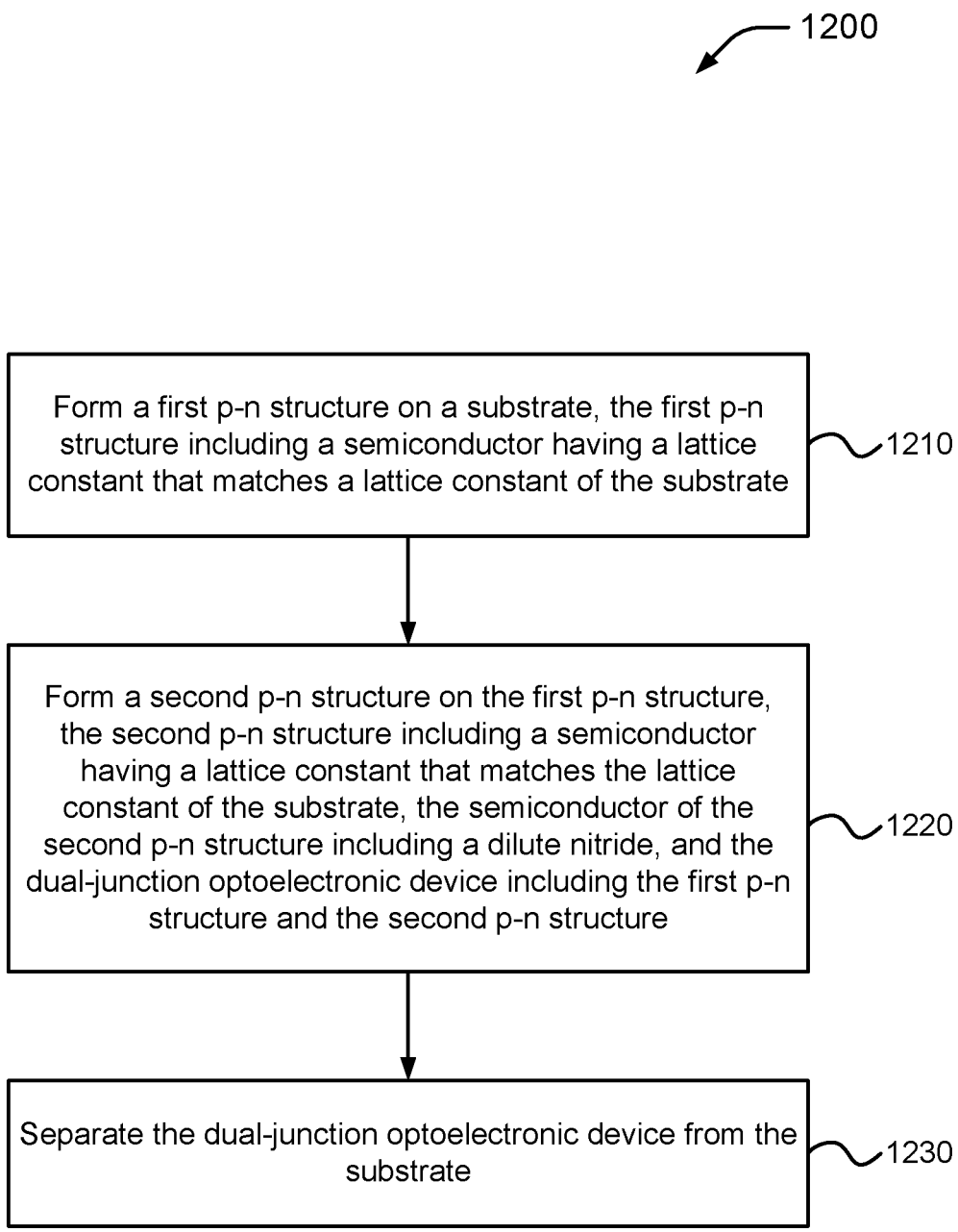

FIG. 12 is a flow chart that illustrates a method 1200 for fabricating a dual-junction optoelectronic in accordance with aspects of this disclosure.

At block 1210, the method 1200 includes forming a first p-n structure on a substrate, the first p-n structure including a semiconductor having a lattice constant that matches a lattice constant of the substrate.

At block 1220, the method 1200 includes forming a second p-n structure on the first p-n structure, the second p-n structure including a semiconductor having a lattice constant that matches the lattice constant of the substrate, the semiconductor of the second p-n structure including a dilute nitride, and the dual-junction optoelectronic device including the first p-n structure and the second p-n structure (see e.g., FIGS. 1C and 1D).

At block 1230, the method 1200 includes separating the dual-junction optoelectronic device from the substrate.

In another aspect of the method 1200, the semiconductor of the first p-n structure includes one or more of GaAs, AlGaAs, InGaP, InGaAs, AlInGaP, AlInGaAs, InGaAsP, AlInGaAsP, alloys thereof, or derivatives thereof.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A method for fabricating a multi junction optoelectronic device, comprising:
    forming a first p-n structure on a substrate, the first p-n structure including a semiconductor having a lattice constant that matches a lattice constant of the substrate;
    forming one or more additional p-n structures on the first p-n structure, each of the one or more additional p-n structures including a semiconductor having a lattice constant that matches the lattice constant of the substrate, the semiconductor of a last of the one or more additional p-n structures that is formed including a dilute nitride, and the multi junction optoelectronic device including the first p-n structure and the one or more additional p-n structures; and
    separating the multi junction optoelectronic device from the substrate,
    wherein:
    forming the first p-n structure on the substrate includes disposing the first p-n structure using a first epitaxial growth process, and
    forming the last of the one or more additional p-n structures includes disposing the last of the one or more additional p-n structures using a second epitaxial growth process different from the first epitaxial growth process.

2. The method of claim 1, wherein forming the one or more additional p-n structures includes forming a second p-n structure after the first p-n structure, and forming a third p-n structure last.

3. The method of claim 1, wherein forming the one or more additional p-n structures includes forming a second p-n structure after the first p-n structure, forming a third p-n structure after the second p-n structure, and forming a fourth p-n structure.

4. The method of claim 1, wherein forming the one or more additional p-n structures includes consecutively forming four or five p-n structures.

5. The method of claim 1, further comprising forming a tunnel junction between any two of the first p-n structure and the one or more additional p-n structures.

6. The method of claim 1, wherein separating the multi junction optoelectronic device from the substrate includes orienting the multi junction optoelectronic device such that the first p-n structure is the one p-n structure nearest a surface of the multi junction optoelectronic device upon which light is to be incident and the last of the one or more additional p-n structures is the one p-n structure that is formed is farthest from that surface.

7. The method of claim 1, further comprising forming, as part of backside processing, additional layers on a surface of the multi junction optoelectronic device nearest the last of the one or more additional p-n structures.

8. The method of claim 1, further comprising providing, for the multi junction optoelectronic device, a support layer having one or more of a dielectric layer, a semiconductor contact layer, a passivation layer, a transparent conductive oxide layer, an anti-reflective coating, a metal coating, an adhesive layer, an epoxy layer, or a plastic coating to increase reflection of light back into the last p-n structure.

9. The method of claim 1, wherein the substrate includes one of GaAs or Ge.

10. The method of claim 1, wherein the semiconductor of the first p-n structure includes one or more of GaAs, AlGaAs, InGaP, InGaAs, AlInGaP, AlInGaAs, InGaAsP, AlInGaAsP, alloys thereof, or derivatives thereof.

11. The method of claim 1, wherein the dilute nitride in the last of the one or more additional p-n structures that is formed includes one or more of GaInNAs, GaInNAsSb, alloys thereof, or derivatives thereof.

12. The method of claim 1, wherein the lattice constant of the semiconductor of the last of the one or more additional p-n structures matches the lattice constant of the substrate with a mismatch or strain of <0.4%.

13. The method of claim 12, wherein the semiconductor in each of the other of the one or more additional p-n structures includes one or more of GaAs, AlGaAs, InGaP, InGaAs, AlInGaP, AlInGaAs, InGaAsP, AlInGaAsP, alloys thereof, or derivatives thereof.

14. The method of claim 1, wherein a bandgap of the semiconductor of the first p-n structure is greater than a bandgap of the dilute nitride in the last of the one or more additional p-n structures that is formed.

15. The method of claim 1, wherein a bandgap of the semiconductor for each respective p-n structure decreases from the first p-n structure to the last of the one or more additional p-n structures.

16. The method of claim 1, wherein:
    forming the first p-n structure on the substrate includes disposing the first p-n structure using an epitaxial growth process, and
    forming the last of the one or more additional p-n structures includes disposing the last of the one or more additional p-n structures using the same epitaxial growth process used for the first p-n structure.

17. The method of claim 1, wherein the any of the first p-n structure and the one or more additional p-n structures is provided by using an epitaxial growth process comprising one or more of:
    a metalorganic chemical vapor deposition (MOCVD) process,
    a hydride vapor phase epitaxy (HVPE) process,
    a molecular beam epitaxy (MBE) process,
    a metalorganic vapor phase epitaxy (MOVPE or OMVPE) process,
    a liquid phase epitaxy (LPE) process,
    a close-space vapor transport (CSVT) epitaxy process, a plasma enhanced chemical vapor deposition (PECVD) process, a physical vapor deposition (PVD) process, an atmospheric pressure chemical vapor deposition (AP-CVD) process, an atomic layer deposition (ALD) process, a low pressure chemical vapor deposition (LPCVD) process, a hot-wire chemical vapor deposition (HWCVD) process, an inductively coupled plasma enhanced chemical vapor deposition (ICP-CVD) process, or other forms of CVD.

18. The method of claim 1, wherein separating the multi junction optoelectronic device from the substrate includes performing an epitaxial lift off (ELO) process for lifting the multi junction optoelectronic device off the substrate.

19. The method of claim 1, further comprising providing a release layer between the substrate and the first p-n structure, wherein separating the multi junction optoelectronic device from the substrate includes removing the release layer.

20. The method of claim 19, wherein the release layer includes AlAs.

21. The method of claim 19, wherein the release layer includes AlGaAs, the concentration is $Al_xGa_{1-x}As$, where x=1 to 0.3.

22. The method of claim 19, wherein the release layer includes AlGaInP, the concentration is $(Al_xGa_{1-x})_{0.5}In_{0.5}P$, where x=1 to 0.

23. The method of claim 1, wherein:

the substrate includes GaAs or Ge, the semiconductor of the first p-n structure includes AlGaInP with a bandgap of approximately 1.75 eV-1.95 eV, and the one or more additional p-n structures include:

a second p-n structure formed after the first p-n structure and having a semiconductor including GaAs, AlInGaAs, or GaInAsP, with a bandgap of approximately 1.3 eV-1.5 eV, and a third p-n structure formed after the second p-n structure, the third p-n structure being the last of the one or more additional p-n structures and having the dilute nitride with a bandgap of approximately 0.9 eV-1.1 eV.

24. The method of claim 1, wherein each of the p-n structures includes at least one p-n junction, a position of the at least one p-n junction being near the front side of the multi-junction optoelectronic device or farther away from the incident side of the light.

25. The method of claim 1, wherein each of the p-n structures can be a heterojunction or a homojunction.

26. The method of claim 1, wherein:

the first epitaxial growth process is performed in a first chamber, and the second epitaxial growth process is performed in a second chamber separate from the first chamber which may or may not be connected to the first chamber.

27. The method of claim 1, wherein:

the first epitaxial growth process is a chemical vapor deposition (CVD) process, and the second epitaxial growth process is a molecular beam epitaxy (MBE) process.

28. A method for fabricating a multi junction optoelectronic device, comprising:

forming a first p-n structure on a substrate, the first p-n structure including a semiconductor having a lattice constant that matches a lattice constant of the substrate;

forming one or more additional p-n structures on the first p-n structure, each of the one or more additional p-n structures including a semiconductor having a lattice constant that matches the lattice constant of the substrate, the semiconductor of a next to last of the one or more additional p-n structures that is formed including a dilute nitride, the semiconductor of a last of the one or more additional p-n structures that is formed including a group IV semiconductor, and the multi junction optoelectronic device including the first p-n structure and the one or more additional p-n structures; and separating the multi junction optoelectronic device from the substrate.

29. The method of claim 28, wherein the dilute nitride in the next to last of the one or more additional p-n structures that is formed includes one or more of GaInNAs, GaInNAsSb, alloys thereof, or derivatives thereof.

30. The method of claim 28, wherein the group IV semiconductor of the last of the one or more additional p-n structures that is formed includes one or more of Ge, Si, Sn, C, alloys thereof, or derivatives thereof.

31. A method for fabricating a multi junction optoelectronic device, comprising:

forming a first p-n structure on a substrate, the first p-n structure including a semiconductor having a lattice constant that matches a lattice constant of the substrate;

forming one or more additional p-n structures on the first p-n structure, each of the one or more additional p-n structures including a semiconductor having a lattice constant that matches the lattice constant of the substrate, the semiconductor of a last of the one or more additional p-n structures that is formed including a dilute nitride, and the multi junction optoelectronic device including the first p-n structure and the one or more additional p-n structures;

separating the multi junction optoelectronic device from the substrate, wherein:

the substrate includes GaAs or Ge, the semiconductor of the first p-n structure includes AlGaInP with a bandgap of approximately 2.0 eV-2.2 eV, and the one or more additional p-n structures include:

a second p-n structure formed after the first p-n structure and having a semiconductor including AlGaInP, GaInAsP, or AlGaAs, with a bandgap of approximately 1.6 eV-1.9 eV, a third p-n structure formed after the second p-n structure and having a semiconductor including GaAs, AlInGaAs, or GaInAsP, with a bandgap of approximately 1.3 eV-1.5 eV, and a fourth p-n structure formed after the third p-n structure, the fourth p-n structure being the last of the one or more additional p-n structures and having the dilute nitride with a bandgap of approximately 1.1 eV-1.3 eV;

forming a fifth p-n structure on the fourth p-n structure, the fifth p-n structure including a semiconductor having a lattice constant that matches the lattice constant of the substrate, the semiconductor of the fifth p-n structure including a dilute nitride with a bandgap of approximately 0.8 eV-1.1 eV; and forming a sixth p-n structure on the fifth p-n structure, the sixth p-n structure including a semiconductor having a lattice constant that matches the lattice constant of the substrate, the semiconductor of the sixth p-n structure including Ge with a bandgap of approximately 0.7 eV.

32. A method for fabricating a multi junction optoelectronic device, comprising:
forming a first p-n structure on a substrate, the first p-n structure including a semiconductor having a lattice constant that matches a lattice constant of the substrate;
forming one or more additional p-n structures on the first p-n structure, each of the one or more additional p-n structures including a semiconductor having a lattice constant that matches the lattice constant of the substrate, the semiconductor of a last of the one or more additional p-n structures that is formed including a dilute nitride, and the multi junction optoelectronic device including the first p-n structure and the one or more additional p-n structures; and
separating the multi junction optoelectronic device from the substrate,
wherein:
the substrate includes GaAs or Ge,
the semiconductor of the first p-n structure includes AlGaInP with a bandgap of approximately 1.75 eV-1.95 eV, and
the one or more additional p-n structures include:
a second p-n structure formed after the first p-n structure and having a semiconductor including GaAs, with a bandgap of approximately 1.3 eV-1.39 eV, and
a third p-n structure formed after the second p-n structure, the third p-n structure being the last of the one or more additional p-n structures and having the dilute nitride with a bandgap of approximately 0.9 eV-1.1 eV.

33. A method for fabricating a multi junction optoelectronic device, comprising:
forming a first p-n structure on a substrate, the first p-n structure including a semiconductor having a lattice constant that matches a lattice constant of the substrate;
forming one or more additional p-n structures on the first p-n structure, each of the one or more additional p-n structures including a semiconductor having a lattice constant that matches the lattice constant of the substrate, the semiconductor of a last of the one or more additional p-n structures that is formed including a dilute nitride, and the multi junction optoelectronic device including the first p-n structure and the one or more additional p-n structures;
separating the multi junction optoelectronic device from the substrate; and
forming a next p-n structure after the last of the one or more additional p-n structures, the next p-n structure including a semiconductor having a lattice constant that matches the lattice constant of the substrate, the semiconductor of the next p-n structure including a group IV semiconductor, and the multi junction optoelectronic device including the first p-n structure, the one or more additional p-n structures, and the next p-n structure,
wherein separating the multi junction optoelectronic device from the substrate includes separating the first p-n structure, the one or more additional p-n structures, and the next p-n structure from the substrate.

34. The method of claim 33, wherein the group IV semiconductor of the next p-n structure includes one or more of Ge, Si, Sn, C, alloys thereof, or derivatives thereof.

* * * * *